(12) United States Patent
Zhang et al.

(10) Patent No.: US 12,051,714 B2
(45) Date of Patent: Jul. 30, 2024

(54) PIXEL STRUCTURE, IMAGE SENSOR, AND METHOD FOR CONTROLLING IMAGE SENSOR

(71) Applicant: SMARTSENS TECHNOLOGY(HK) CO., LIMITED, Kwun Tong Kowloon (HK)

(72) Inventors: Shengxin Zhang, Kwun Tong Kowloon (HK); Chen Xu, Kwun Tong Kowloon (HK)

(73) Assignee: SMARTSENS TECHNOLOGY(HK) CO., LIMITED, Kwun Tong Kowloon (CN)

( * ) Notice: Subject to any disclaimer, the term of this patent is extended or adjusted under 35 U.S.C. 154(b) by 116 days.

(21) Appl. No.: 17/739,214

(22) Filed: May 9, 2022

(65) Prior Publication Data
US 2023/0290803 A1 Sep. 14, 2023

(30) Foreign Application Priority Data

Mar. 9, 2022 (CN) .......................... 202210225684.X
Mar. 9, 2022 (CN) .......................... 202220497121.1

(51) Int. Cl.
*H01L 27/146* (2006.01)
*H04N 25/75* (2023.01)
*H04N 25/771* (2023.01)

(52) U.S. Cl.
CPC .. *H01L 27/14643* (2013.01); *H01L 27/14612* (2013.01); *H01L 27/14621* (2013.01); *H01L 27/14636* (2013.01); *H04N 25/75* (2023.01); *H04N 25/771* (2023.01)

(58) Field of Classification Search
CPC ......... H01L 27/14643; H01L 27/14612; H01L 27/14621; H01L 27/14636; H01L 27/14603; H01L 27/14641; H04N 25/75; H04N 25/771; H04N 25/585; H04N 25/59; H04N 25/77; H04N 25/778; H04N 25/587
See application file for complete search history.

(56) References Cited

U.S. PATENT DOCUMENTS 10,165,215 B2 * 12/2018 Numata ............... H04N 25/778
10,510,796 B1 * 12/2019 Wang .................... H04N 25/778
11,570,386 B2 * 1/2023 Shin ....................... H04N 25/77
(Continued)

*Primary Examiner* — Shahbaz Nazrul
(74) *Attorney, Agent, or Firm* — IPRTOP LLC

(57) ABSTRACT

A pixel structure, an image sensor, an electronic device and a method for controlling an image sensor are provided. The pixel structure includes a plurality of pixel units arranged in an array, each pixel unit includes a first photoelectric conversion element; first transfer transistor, coupled to a first floating diffusion region, for transferring charges in the first photoelectric conversion element to the first floating diffusion region; a second photoelectric conversion element, where the sensitivity of the second photoelectric conversion element is lower than that of the first photoelectric conversion element; a second transfer transistor, coupled to a second floating diffusion region, for transferring charges in the second photoelectric conversion element to the second floating diffusion region; and a reading circuit, coupled to the first floating diffusion region and the second floating diffusion region, for reading voltage signals of the first floating diffusion region and the second floating diffusion region.

26 Claims, 11 Drawing Sheets

(56) References Cited

U.S. PATENT DOCUMENTS

| | | | | |
|---|---|---|---|---|
| 2014/0078368 A1* | 3/2014 | Komori | ................. | H04N 25/77 |
| | | | | 348/307 |
| 2022/0123033 A1* | 4/2022 | Park | ....................... | H04N 25/59 |
| 2022/0321822 A1* | 10/2022 | Yang | ................. | H01L 27/14641 |
| 2023/0076177 A1* | 3/2023 | Lim | ......................... | B60R 1/22 |
| 2023/0134685 A1* | 5/2023 | Lim | ...................... | H04N 25/77 |
| | | | | 348/311 |
| 2023/0171515 A1* | 6/2023 | Kim | ...................... | H04N 25/42 |
| | | | | 348/216.1 |
| 2023/0224608 A1* | 7/2023 | Lim | ...................... | H04N 25/79 |
| | | | | 348/207.99 |

* cited by examiner

PIXEL STRUCTURE, IMAGE SENSOR, AND METHOD FOR CONTROLLING IMAGE SENSOR

CROSS REFERENCE TO RELATED APPLICATIONS

This application claims the benefits of priority to Chinese Patent Application No CN 202210225684X, entitled "Pixel Structure, Image Sensor, Electronic Device and Method for Controlling An Image Sensor", filed with CNIPA on Mar. 9, 2022, and also claims the benefits of priority to Chinese Patent Application No. CN 2022204971211, entitled "Pixel Structure, Image Sensor, and Electronic Device", filed with CNIPA on Mar. 9, 2022, the content of which is incorporated herein by reference in its entirety.

FIELD OF TECHNOLOGY

The invention relates to the field of image sensing, and more specifically, to a pixel structure, an image sensor, and a method for controlling an image sensor.

BACKGROUND

Image sensors are an important part of a digital camera. Image sensors are mainly divided into two types: charge coupled devices (CCD) and complementary metal oxide semiconductor (CMOS). With the continuous development of a CMOS integrated circuit manufacturing process, especially the design and manufacturing process of the CMOS image sensors, the CMOS image sensors has gradually replaced the CCD image sensors. Compared with the CCD image sensors, CMOS image sensors has continued to advance at great pace. For example, the demands of higher resolution and lower power consumption have encouraged the further miniaturization and integration of these image sensors. However, miniaturization has come with the loss of pixel photo-sensitivity and dynamic range which require new approaches in order to mitigate.

Currently, standard image sensors have a limited dynamic range of 60 dB to 70 dB. However, the dynamic range of the brightness in the real world is much wider. The dynamic range of the brightness of natural scenes exceeds 90 dB. To capture both strong light and weak light simultaneously, high dynamic range (HDR) technology has been applied to image sensors to increase the dynamic range of the image sensors. The most common technique to increase the dynamic range is to combine multiple exposure images captured by standard image sensors (with a low dynamic range) into a single linear HDR image. The single linear HDR image has a much wider dynamic range than a single exposure image.

However, it is difficult to effectively improve the dynamic range of the image sensors while maintaining the performance of the image sensors in the prior art. In addition, sometimes it is necessary to photograph environments with flickering, such as vehicles equipped with image sensors for recognizing traffic signs, traffic signs include signal lights composed of LED lights with extremely high flickering frequency. The traditional in-vehicle image sensors adopt a single pixel for identifying the brightness with a limited dynamic range. In several applications, such as automotive applications, the roughly 60 dB dynamic range of a standard CMOS image sensor does not allow retention of all the relevant information content of a captured scene, for example, strong light information and weak light information. This will lead to misjudgment of traffic signs, thereby leading to traffic accidents.

SUMMARY

The present disclosure provides a pixel structure; the pixel structure comprises a plurality of pixel units arranged in an array, each pixel unit comprises a first photoelectric conversion element, a first transfer transistor, coupled to a first floating diffusion region, for transferring charges in the first photoelectric conversion element to the first floating diffusion region; a second photoelectric conversion element, the sensitivity of the second photoelectric conversion element is lower than that of the first photoelectric conversion element a second transfer transistor, coupled to a second floating diffusion region, for transferring charges in the second photoelectric conversion element to the second floating diffusion region; a reading circuit, coupled to the first floating diffusion region and the second floating diffusion region, for reading voltage signals of the first floating diffusion region and the second floating diffusion region.

The present disclosure provides an image sensor, and the image sensor comprises a pixel structure as described above.

The present disclosure provides an electronic device, and the electronic device comprises an image sensor as described above.

The present disclosure provides a method for controlling an image sensor, applicable to the image sensor as described above. The method comprises: reading information of a first pixel, the first pixel comprises a first photoelectric conversion element and a first transfer transistor, and the step of reading the information of a first pixel comprises: resetting a storage region of the first pixel, and quantizing to obtain a first reset signal; transferring image information of the first photoelectric conversion element, and quantizing to obtain a first image sampling signal; reading information of a second pixel, the second pixel comprises a second photoelectric conversion element and a second transfer transistor, the step of reading information of a second pixel comprises: transferring image information of the second photoelectric conversion element, and quantizing to obtain a second image sampling signal; wherein, a first actual image signal of the first pixel is obtained based on the first reset signal and the first image sampling signal, and a second actual image signal of the second pixel is obtained based on the second image sampling signal.

As described above, the pixel structure, the image sensor, and the method for controlling the image sensor in the present disclosure have the following beneficial effects:

The present disclosure adopts the first photoelectric conversion element and the second photoelectric conversion element, which have different sensitivities. The first photoelectric conversion element has high sensitivity (due to, e.g., a large area), which is mainly used to obtain weak light information, and the second photoelectric conversion element has low sensitivity (due to, e.g., a small area), which is mainly used to obtain strong light information. Therefore, the image sensor of the present disclosure is able to recognize strong light information and low light information, which improves its dynamic range.

The present disclosure designs the layout of the pixel structure, which may effectively reduce a signal noise, improve a reading accuracy, and reduce the amount of electrons flowing from the first photoelectric conversion element (e.g., with a relatively larger area) to the second photoelectric conversion element (e.g., with a relatively smaller area), thereby improving the performance of the image sensor.

REFERENCE NUMERALS

Figure 1:
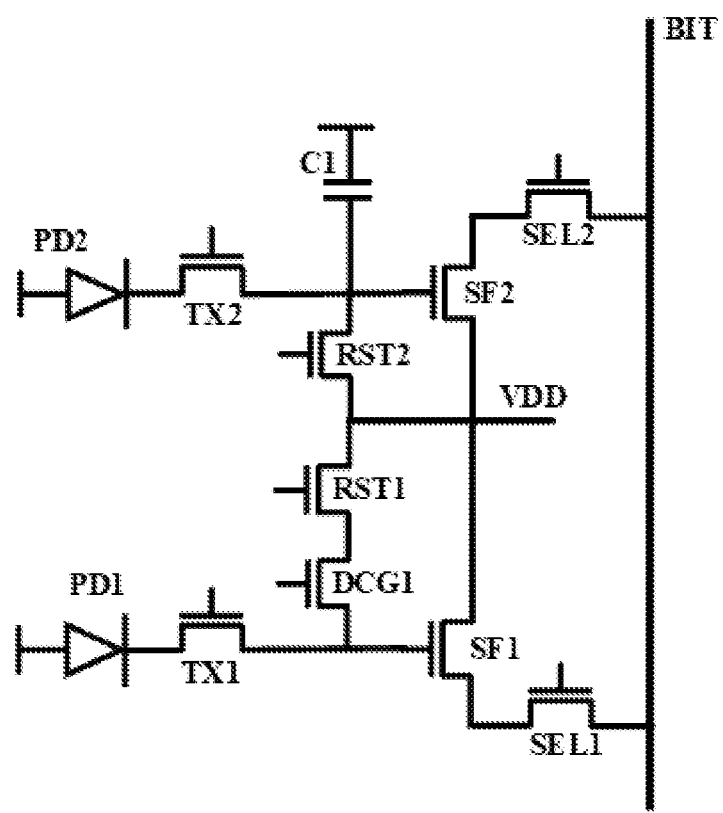
FIG. 1 is a schematic diagram of a circuit principle of a pixel structure according to Embodiment 1 of the present disclosure.

100, 400 First pixel
200, 500 Second pixel
300, 600 Third pixel
PD1, PD3 First photoelectric conversion element
TX1, TX3 First transfer transistor
PD2, PD4 Second photoelectric conversion element
TX2, TX4 Second transfer transistor
RST1 First reset transistor
SF1 First source follower transistor
SEL1 First row select transistor
RST2 Second reset transistor
SF2 Second source follower transistor
SEL2 Second row select transistor
DCG1, DCG2 Dual conversion gain control transistor
C1, C2 Capacitor
SUB Substrate contact
SW Switching transistor
RST3 Reset transistor
SF3 Source follower transistor
SEL3 Row select transistor

DETAILED DESCRIPTION

The implementations of the present disclosure are described below through specific examples. Those skilled in the art can easily understand the other advantages and effects of the present disclosure from the content disclosed in this specification. The present disclosure may also be implemented or applied through other different specific implementations. Various details in this specification may also be modified or changed based on different viewpoints and applications without departing from the spirit of the present disclosure.

It should be emphasized that the term "comprise/include" as used herein refers to the presence of a feature, whole, step or component, but does not exclude the presence or addition of one or more other features, whole, steps or components.

Features described and/or illustrated for one embodiment may be used in the same or similar manner in one or more other embodiments, in combination with, or replacing certain features in other embodiments.

For example, when describing the embodiments of the present disclosure in detail, for ease of description, a cross-sectional view for showing a device structure is partially enlarged not necessarily to scale, and the schematic diagram is merely an example and is not intended to limit the scope of the present disclosure. In addition, the three-dimensional spatial dimensions of length, width and depth should be included in the actual production.

For ease of description, spatial terms, such as "under", "below", "lower", "beneath", "above", "upper", and the like, may be used herein to describe the relationship between one element or feature and another element or feature as shown in the accompanying drawings. It is to be understood that these spatial terms are intended to encompass other directions of the device in use or operation than the directions depicted in the accompanying drawings. In addition, when a layer is referred to as being "between" two layers, the layer may be the only layer between the two layers, or one or more layers may be present therebetween.

In the context of this present disclosure, a structure in which a first feature is described as being "on" a second feature may include an embodiment in which the first feature and the second feature are in direct contact with each other, or may include an embodiment in which there is another feature formed between the first feature and the second feature. In other words, the first feature and the second feature may not be in direct contact with each other.

It should be noted that, the drawings provided in this embodiment only exemplify the basic idea of the present disclosure. Although only the components related to the present disclosure are shown in the drawings, they are not drawn according to the quantities, shapes, and sizes of the components during actual implementation. During actual implementation, the patterns, quantities, and proportions of the components may be changed as needed, and the layout of the components may be more complicated.

The traditional in-vehicle image sensors adopt a single pixel for identifying the brightness with a limited dynamic range. So the traditional in-vehicle image sensors are unable to identify brightness information out of the dynamic range, for example, strong light information and weak light information. This will lead to misjudgment of traffic signs, thereby leading to traffic accidents. The present disclosure provides a pixel structure, an image sensor, and a method for controlling the image sensor. The present disclosure may solve the problem of a narrow dynamic range of traditional image sensors in the prior art, and a narrow dynamic range makes it difficult to capture weak light and strong light. In light of the above problem, the present disclosure provides a pixel structure. The pixel structure includes a plurality of pixel units arranged in an array. Each pixel unit includes a first photoelectric conversion element; a first transfer transistor, coupled to a first floating diffusion region, for transferring charges in the first photoelectric conversion element to the first floating diffusion region; a second photoelectric conversion element, the sensitivity of the second photoelectric conversion element is lower than that of the first photoelectric conversion element; a second transfer transistor, coupled to a second floating diffusion region, for transferring charges in the second photoelectric conversion element to the second floating diffusion region; and a reading circuit, coupled to the first floating diffusion region and the second floating diffusion region, for reading voltage signals of the first floating diffusion region and the second floating diffusion region. The sensitivity of the second photoelectric conversion element is lower than that of the first photoelectric conversion element. For example, a photosensitive area of the second photoelectric conversion element may be set to be smaller than that of the first photoelectric conversion element, so that the first photoelectric conversion element may be used to obtain weak light information, and the second photoelectric conversion element may be used to obtain strong light information, so that the image sensor may be compatible to recognize weak light information and strong light information. Therefore, the dynamic range of the image sensor is improved. In other embodiments, the sensitivity of the second photoelectric conversion element is set lower than that of the first photoelectric conversion element in other ways.

For example, an attenuation layer is disposed on the second photoelectric conversion element, etc., and the present disclosure is not limited to examples listed herein.

Embodiment 1

Figure 2:
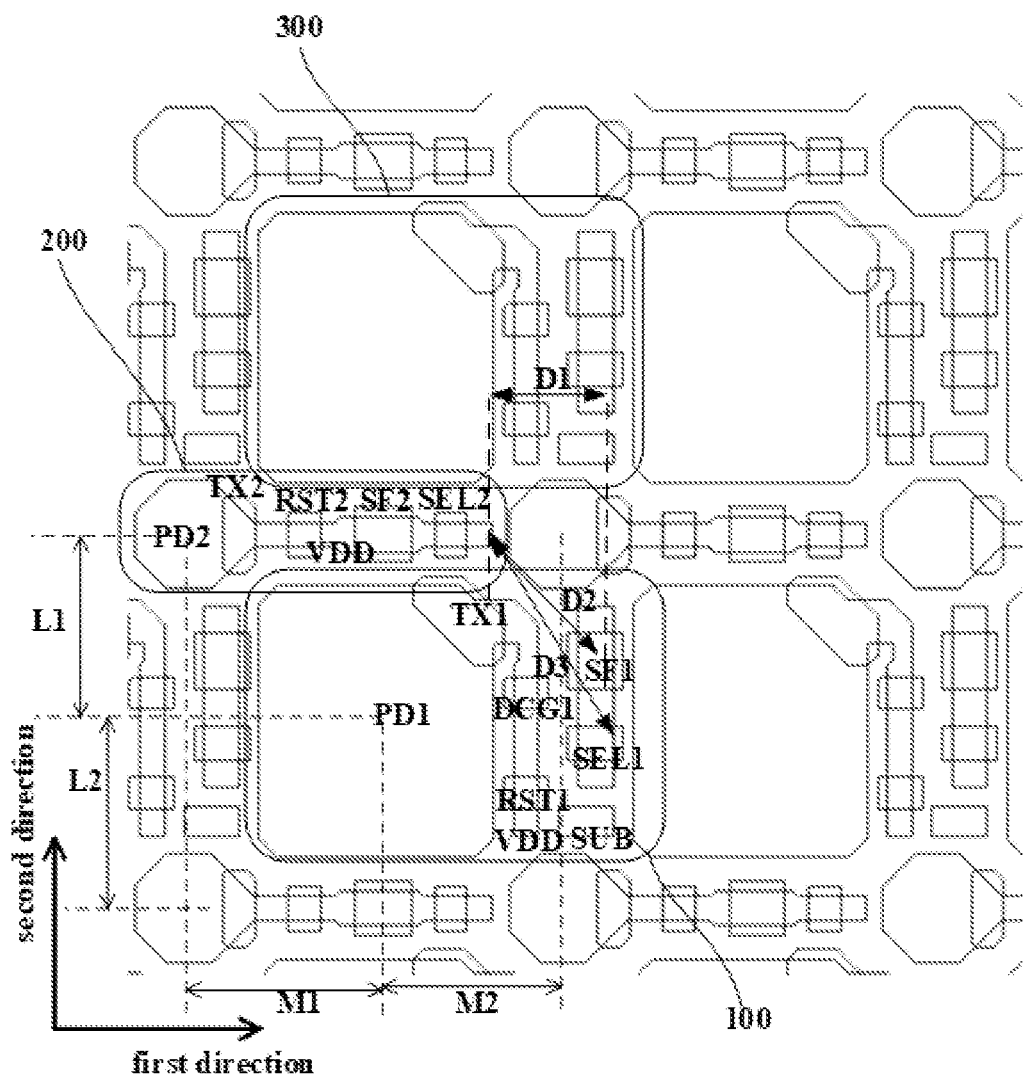
FIG. 2 and FIG. 3 are structural diagrams of the layout of a pixel structure according to Embodiment 1 of the present disclosure.
Figure 3:
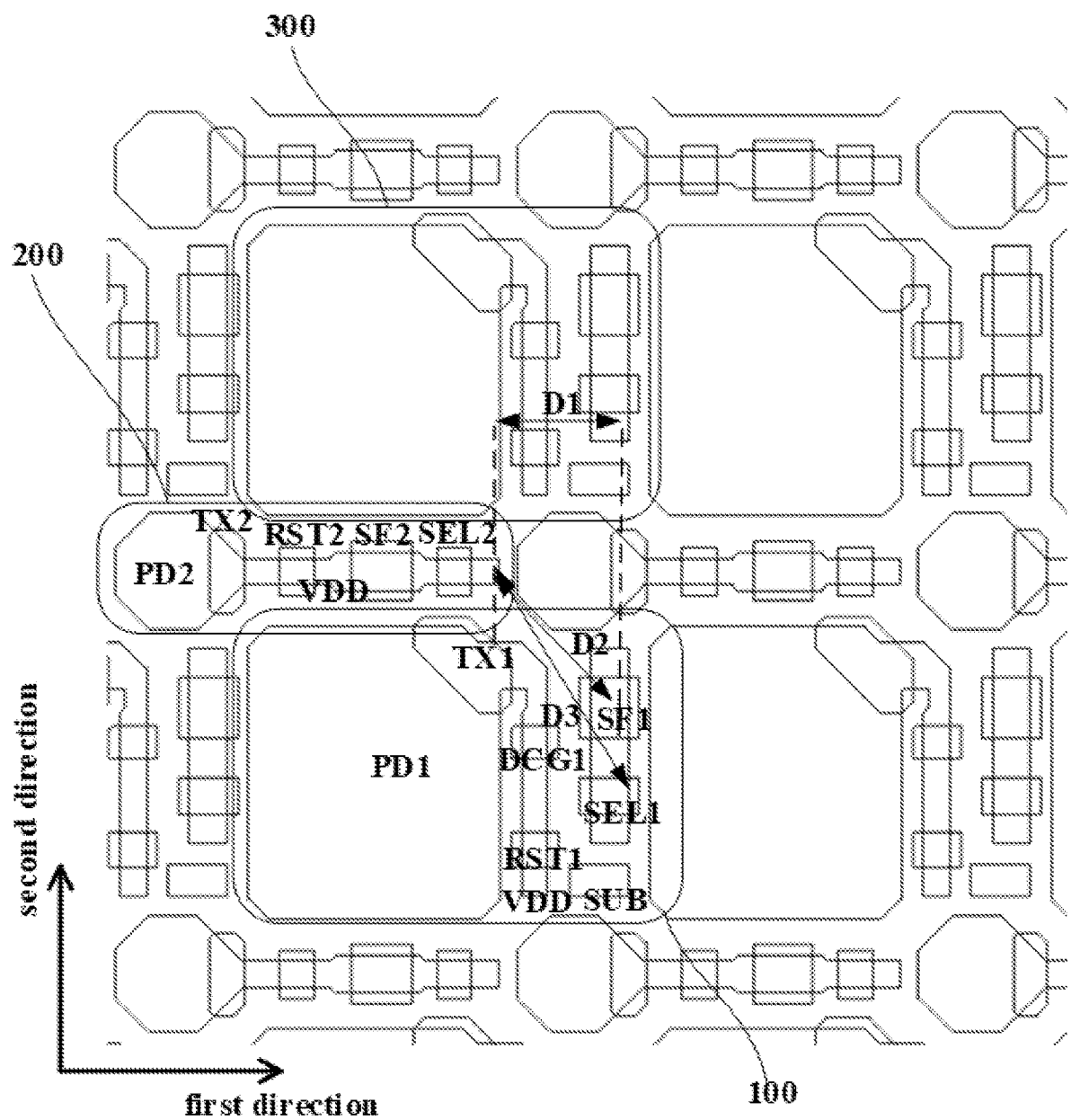

As shown in FIGS. 1-3, a pixel structure is provided in the embodiment. The pixel structure includes a plurality of pixel units arranged in an array. Each pixel unit includes a first photoelectric conversion element PD1, a first transfer transistor TX1, a second photoelectric conversion element PD2, a second transfer transistor TX2 and a reading circuit.

The first photoelectric conversion element PD1 is used to capture weak light, and is used to convert light signals (e.g., weak light) into electrical signals. The function of the first photoelectric conversion element PD1 may be set based on an actual situation of a captured scene. The first photoelectric conversion element PD1 includes a photodiode, for example, a PPD type photodiode.

The first transfer transistor TX1 is coupled to a first floating diffusion region, and is for transferring charges in the first photoelectric conversion element PD1 to the first floating diffusion region. In an embodiment, the first floating diffusion region is a shared charge collection region in other embodiments, the first floating diffusion region includes several floating diffusion points, and the sum of charges collected by all floating diffusion points are charges collected by the first floating diffusion region. The first photoelectric conversion element PD1, the first transfer transistor TX1 and the first floating diffusion region may adopt existing structures in prior art.

The sensitivity of the second photoelectric conversion element PD2 is lower than that of the first photoelectric conversion element PD1. The second photoelectric conversion element PD2 is used to capture strong light, and is used to convert light signals (e.g., strong light) into electrical signals. The second photoelectric conversion element PD2 includes a photodiode, for example, a PPD type photodiode.

The second transfer transistor TX2 is coupled to a second floating diffusion region, and is for transferring charges in the second photoelectric conversion element PD2 to the second floating diffusion region. In some embodiments, the second floating diffusion region is a shared charge collection region; in other embodiments, the second floating diffusion region includes several floating diffusion points, and the sum of charges collected by all floating diffusion points are charges collected by the second floating diffusion region. The second photoelectric conversion element PD2, the second transfer transistor TX2 and the second floating diffusion region may adopt existing structures in prior art.

As shown in FIG. 1, the reading circuit includes a first reset transistor RST1, a first source follower transistor SF1, a second reset transistor RST2 and a second source follower transistor SF2. In some embodiments, the above transistors are N type Metal-Oxide-Semiconductor (NMOS) transistors.

A source of the first reset transistor RST1 is coupled to the first floating diffusion region, and a drain of the first reset transistor RST1 is coupled to a first voltage terminal, so as to reset the first floating diffusion region. A gate of the first reset transistor RST1 is connected to a first reset signal terminal, so as to reset the first floating diffusion region under the control of a first reset signal provided by the first reset signal terminal.

A gate of the first source follower transistor SF1 is coupled to the first floating diffusion region, a drain of the first source follower transistor SF1 is coupled to a second voltage terminal, and a source of the first source follower transistor SF1 is coupled to a first output line.

A source of the second reset transistor RST2 is coupled to the second floating diffusion region, and a drain of the second reset transistor RST2 is coupled to a third voltage terminal, so as to reset the second floating diffusion region. A gate of the second reset transistor RST2 is connected to a second reset signal terminal, so as to reset the second floating diffusion region under the control of a second reset signal provided by the first reset signal terminal.

A gate of the second source follower transistor SF2 is coupled to the second floating diffusion region, a drain of the second source follower transistor SF2 is coupled to a fourth voltage terminal, and a source of the second source follower transistor SF2 is coupled to a second output line.

The first output line and the second output line may be two different output lines or a shared output line, which determines whether the signals are output in parallel or in serial. In an embodiment, the second output line and the first output line are a shared output line BIT.

In one embodiment, the first voltage terminal, the second voltage terminal, the third voltage terminal and the fourth voltage terminal are the same voltage terminal VDD, so as to simplify circuit design and wiring. The above setting may save cost and improve the accuracy of signals.

In an embodiment, the reading circuit further includes a double conversion gain control transistor DCG1. The double conversion gain control transistor DCG1 is coupled between the first floating diffusion region and the first reset transistor RST1 to improve a dynamic range of the pixel structure. The double conversion gain control transistor DCG1 may be an NMOS transistor. In addition, a capacitor may also be set between the first reset transistor RST1 and the double conversion gain control transistor DCG1, and the capacitor may be a parasitic capacitor or a device capacitor. A low conversion gain mode and a high conversion gain mode may be switched to each other by turning on and turning off the double conversion gain control transistor DCG1.

In an embodiment, the reading circuit includes a first row select transistor SEL1. A drain of the first row select transistor SEL1 is coupled to the source of the first source follower transistor SF1, and a source of the first row select transistor SEL1 is coupled to the first output line. The first row select transistor SEL1 adopts an NMOS transistor.

In an embodiment, the reading circuit includes a second row select transistor SEL2. A drain of the second row select transistor SEL2 is coupled to the source of the second source follower transistor SF2, and a source of the second row select transistor SEL2 is coupled to the second output line. The second row select transistor SEL2 adopts an NMOS transistor.

It should be noted that the ratio of the number of the first pixel to the number of the second pixel may be the ratio of the number of the first photoelectric conversion element PD1 and the number of the second photoelectric conversion element PD2. The ratio of the number of the first photoelectric conversion element PD1 and the number of the second photoelectric conversion element PD2 may be set according to actual needs. For example, the ratio is 1:1, 2:1:4:1, and the like. In the embodiment, as shown in FIG. 2 and FIG. 3, the ratio is 1:1.

In an embodiment, as shown in FIG. 2 and FIG. 3, the first pixel 100 includes the first photoelectric conversion element PD1, the first transfer transistor TX1, the first floating diffusion region, the first reset transistor RST1, the first source follower transistor SF1 and the first row select transistor SEL1. And multiple first pixels arranged in a first direction. The second pixel 200 includes the second photoelectric conversion element PD2, the second transfer transistor TX2, the second floating diffusion region, the second reset transistor RST2, the second source follower transistor SF2 and the second row select transistor SEL2. And multiple second pixels arranged in the first direction. A plurality of first pixels 100 are arranged in an array, and a plurality of second pixels 200 are arranged in an array.

In an embodiment, multiple first pixels are arranged in rows along the first direction, and are arranged in columns along a second direction. Optionally, the first direction is perpendicular to the second direction. Meanwhile, multiple second pixels are arranged in rows along the first direction, and are arranged in columns along the second direction. In addition, projections of each first photoelectric conversion element of first pixels in the first direction and projections of each second photoelectric conversion element of second pixels in the first direction are alternately arranged, and projections of each first photoelectric conversion element in first pixels in the second direction and projections of each second photoelectric conversion element in second pixels in the second direction are alternately arranged.

In an embodiment, the first pixel 100 and the second pixel 200 adjacent to the first pixel 100 form a pixel unit, and a distance between a projection of the first row select transistor SEL1 of the first pixel 100 in the first direction and a projection of the second row select transistor SEL2 of the second pixel 200 in the first direction is shorter than distances between the projection of the first row select transistor SEL1 of the first pixel 100 in the first direction and projections of second row select transistors of other pixels in the first direction. As shown in FIG. 2, the first row select transistor SEL1 is selected first. The second row select transistor SEL2 is selected because the distance D1 between the projection of the first row select transistor SEL1 of the first pixel 100 in the first direction and the projection of the second row select transistor SEL2 of the second pixel 200 in the first direction is shorter than distances between the projection of the first row select transistor SEL1 of the first pixel 100 in the first direction and projections of second row select transistors of other pixels in the first direction. Therefore, the first pixel 100 including the first row select transistor SEL1 and the second pixel 200 including the second row select transistor SEL2 are selected to form the pixel unit. The distance D1 is shown in FIG. 3. Based on the above description, any one of the two pixels (e.g., including the first pixel 100 and a third pixel 300, for ease of description, wherein another first pixel adjacent to the second pixel 200 in FIGS. 2-3 is referred to as the third pixel 300) adjacent to the second pixel 200 and the second pixel 200 form the pixel unit, which facilitates wiring of the pixel unit and the transmission of image signals.

In an further embodiment, the first row select transistor SEL1 and the second row select transistor SEL2 share the output line BIT, and the distance D1 is shorter, which facilitates the wiring of the output line BIT in the pixel unit. The setting of the output line BIT may reduce signal noise and improve readout accuracy.

In an embodiment, as shown in FIG. 3, in one pixel unit, a distance D2 between the first source follower transistor SF1 of the first pixel 100 and the second pixel 200 is set to be less than a distance D3 between the first row select transistor SEL1 of the first pixel 100 and the second pixel 200. This setting makes the first source follower transistor SF1 of the first pixel 100 adjacent to the first floating diffusion region, to facilitate the output of the first floating diffusion region, improve the signal conversion gain, and reduce the noise. In an embodiment, the distance D2 is a distance between the first source follower transistor SF1 of the first pixel 100 and the second row select transistor SEL2 of the second pixel 200; the distance D3 is a distance between the first row select transistor SEL1 of the first pixel 100 and the second row select transistor SEL2 of the second pixel 200.

In the two pixels (the first pixel 100 and the third pixel 300) adjacent to the second pixel 200, the distance D1 between the projection of the first row select transistor SEL1 of the first pixel 100 in the first direction and the projection of the second row select transistor SEL2 of the first pixel 200 in the first direction is equal to that between a projection of a third row select transistor (not labeled in FIGS. 2-3) of the third pixel 300 in the first direction and the projection of the second row select transistor SEL2 of the first pixel 200 in the first direction. However, the distance between the first source follower transistor SF1 of the first pixel 100 and the second pixel 200 is shorter than that between the source follower transistor of the third pixel 300 and the second pixel 200. Therefore, the first pixel 100 and the second pixel 200 form the pixel unit in the embodiment, to obtain a better layout and improve the performance of the image sensor.

In an embodiment, as shown in FIG. 2, each second photoelectric conversion element PD2 is disposed at a center of a pattern formed by four first photoelectric conversion elements PD1 arranged in an array, and the second transfer transistor TX2, the second reset transistor RST2, the second source follower transistor SF2, and the second row select transistor SEL2 are sequentially arranged between two adjacent second photoelectric conversion elements PD2 along the first direction. In another embodiment, the first reset transistor RST1, the first source follower transistor SF1, and the first row select transistor SEL1 are arranged between two adjacent second photoelectric conversion elements PD2 along the second direction perpendicular to the first direction. Further, each of four corner regions of each first photoelectric conversion element PD1 (in this embodiment, PD1 has four corners) is also correspondingly provided with a second photoelectric conversion element PD2, and each of four corner regions of each second photoelectric conversion element PD2 (in this embodiment, PD2 has four corners) is also correspondingly provided with a first photoelectric conversion element PD1.

In an embodiment, when the pixel unit further includes a dual conversion gain control transistor DCG1. The dual conversion gain control transistor DCG1 and the first reset transistor RST1 are arranged in a column along the second direction, the first source follower transistor SF1 and the first row select transistor SEL1 are arranged in a column along the second direction, and the dual conversion gain control transistor DCG1 and the first reset transistor RST1 are arranged close to the first photoelectric conversion element PD1 in a same pixel unit. Among them, the gain control transistor DCG1, the first reset transistor RST1 and the first photoelectric conversion element PD1 are arranged in the first pixel 100.

In an embodiment, the pixel unit further includes a substrate contact SUB. The substrate contact SUB is disposed on a side of the first row select transistor SEL1 along the second direction, the side of the first row select transistor SEL1 is facing away from the first source follower transistor SF1. Under a certain potential, a potential barrier for the tow of electrons is formed on the substrate contact SUB, and the potential barrier may effectively block the leakage of electrons in the first pixel 100 to the surrounding second pixels 200, isolating the first pixel 100 from the second pixel 200.

In an embodiment, in one pixel unit, a distance between a projection of a center of the first photoelectric conversion element PD1 in the second direction and a projection of a center of the second photoelectric conversion element PD2 in the second direction is a first distance L1. In two adjacent pixel units, a distance between a projection of a center of the first photoelectric conversion element PD1 of one pixel unit in the second direction and a projection of a center of the second photoelectric conversion element PD2 of the other pixel unit in the second direction is a second distance L2. The first distance L1 is larger than the second distance L2 In the embodiment, in one pixel unit, the first photoelectric conversion element PD1 is relatively far away from the second photoelectric conversion element PD2, so that when electrons are being leaked, paths for electrons to leak from the first photoelectric conversion element PD1 to the second photoelectric conversion element PD2 are also longer, so that leaked electrons are more easily absorbed by the voltage terminal VDD of the same first pixel. That is, because the voltage terminal VDD is closer to the first photoelectric conversion element PD1, part of electrons leaked from the first photoelectric conversion element PD1 flows to the voltage terminal VDD. Therefore, the number of electrons leaked from the first photoelectric conversion element PD1 to the second photoelectric conversion element PD2 is reduced, which improve the image accuracy.

In an embodiment, in one pixel unit, a distance between the projection of the center of the first photoelectric conversion element PD1 in the first direction and the projection of the center of the second photoelectric conversion element PD2 in the first direction is a third distance M1. In two adjacent pixel units, a distance between the projection of the center of the first photoelectric conversion element PD1 of one pixel unit in the first direction and the projection of the center of the second photoelectric conversion element PD2 of the other pixel unit in the first direction is a fourth distance M2. The third distance M1 is equal to the fourth distance M2.

In an embodiment, an area of the first photoelectric conversion element PD1 is larger than that of the second photoelectric conversion element PD2, so that the sensitivity of the second photoelectric conversion element PD2 is lower than that of the first photoelectric conversion element PD1.

In an embodiment, the pixel structure also includes one or more an attenuation layers, and there is at least one anti-reflection layer disposed between the second photoelectric conversion element PD2 and an incident light, so that the sensitivity of the second photoelectric conversion element PD2 is lower than that of the first photoelectric conversion element PD1. The attenuation layer may adopt existing attenuation structures. For example, an material layer, or a metal grid are arranged between the photoelectric conversion element and the incident light. The attenuation layer is facing a light-receiving surface of the second photoelectric conversion element PD2. In another embodiment, the attenuation layer may be further extended to the first photoelectric conversion element PD1.

In an embodiment, in one pixel unit, the first pixel 100 and the second pixel 200 are respectively provided with a color filter of the same color. For example, multiple first pixels 100 may form a Bayer array arrangement, and multiple second pixels 200 may form a Bayer array arrangement. The other color filters may be configured according to actual needs. In the embodiment, the first pixel 100 and the second pixel 200 of one pixel unit are respectively provided with a color filter of the same color. That is, color filters of the same color are configured on the first photoelectric conversion element PD1 and the second photoelectric conversion element PD2 in one pixel unit.

In an embodiment, in one pixel unit, the first pixel 100 corresponds to a first lens, and the second pixel 200 corresponds to a second lens. In the embodiment, each of the first pixels 100 corresponds to a corresponding one of the first lenses, and each of the second pixels 200 corresponds to a corresponding one of the second lenses. The first lens and the second lens may be different, for example, the height of the first lens is different from that of the second lens.

In an embodiment, as shown in FIG. 1, the pixel unit includes a charge storage device. A terminal of the charge storage device is coupled to the second floating diffusion region, and the other terminal of the charge storage device is connected to ground or a variable voltage.

In an embodiment, the charge storage device is a capacitor C1. The charge storage device is used to storage charges generated by the second photoelectric conversion element PD2, to increase a full well capacity of the second pixel 200 and to reduce the sensitivity of the photoelectric conversion element. Optionally, the capacitor C1 is a device capacitance or a parasitic capacitance.

The present disclosure also provides an image sensor. The image sensor includes the pixel structure described in the above embodiments. The image sensor further includes a peripheral logic circuit for receiving and processing signals output by the reading circuit of the pixel structure. The image sensor may be a complementary metal oxide semiconductor (CMOS) image sensor, or may be other image sensors that may use pixel structures described in the above embodiments.

The present disclosure also provides an electronic device is provided. The electronic device includes the image sensor described in the above embodiments. The electronic device may be a mobile device, a digital camera, a medical device, or a computer. The electronic device includes the image sensor The specific structure of the image sensor refers to the above embodiments. Since the electronic device adopts all the technical solutions of all the above embodiments, it has at least all the beneficial effects brought by the technical solutions of the above embodiments. In addition, the electronic equipment may also be monitoring equipment, machine vision related device, UAV, mobile phones, cameras, and the like.

As shown in FIGS. 4-7, the present disclosure also provides a method for controlling an image sensor, which is applicable to the image sensor described in the above embodiments. The method includes step 110 and step 120.

Step 110, reading information of the first pixel 100, where the first pixel 100 includes the first photoelectric conversion element PD1 and the first transfer transistor TX1. The step 110 of reading information of the first pixel 100 includes step 111 and step 112.

Step 111, resetting a storage region of the first pixel 100, and quantizing it to obtain a first reset signal Vrst1. In one embodiment, the quantizing is performed by an analogue-to-digital converter, or other hardware or software that is capable of implementing signal conversion, and the first reset signal Vrst1 includes information of the storage region; the term "quantizing" hereinafter may be interpreted in a similar way.

Step 112, transferring image information of the first photoelectric conversion element PD1, and quantizing it to obtain a first image sampling signal Vsig1.

Step 120, reading information of the second pixel 200, where the second pixel 200 includes the second photoelectric conversion element PD2 and the second transfer transistor TX2. The step 120 of reading information of the second pixel 200 includes step 121.

Step 121, transferring image information of the first photoelectric conversion element PD2, and quantizing it to obtain a second image sampling signal Vsig2.

A first actual image signal of the first pixel 100 is obtained based on the first reset signal Vrst1 and the first image sampling signal Vsig1, and a second actual image signal of the second pixel 200 is obtained based on the second image sampling signal Vsig2. It should be noted that the execution sequence of steps 111, 112, and 121 does not strictly represent the execution sequence of each step of the method in the present disclosure, and those skilled in the art may change the execution sequence of the above steps according to actual needs. Based on a reading mode of the first pixel, a correlation double sampling (CDS) may be realized.

In an embodiment, step 120 of reading information of the second pixel 200 also includes:

Step 122, resetting a storage region of the second pixel 200, and quantizing it to obtain a second reset signal Vrst2; and obtaining a second actual image signal based on the second reset signal Vrst2 and the second image sampling signal Vsig2.

Figure 4:
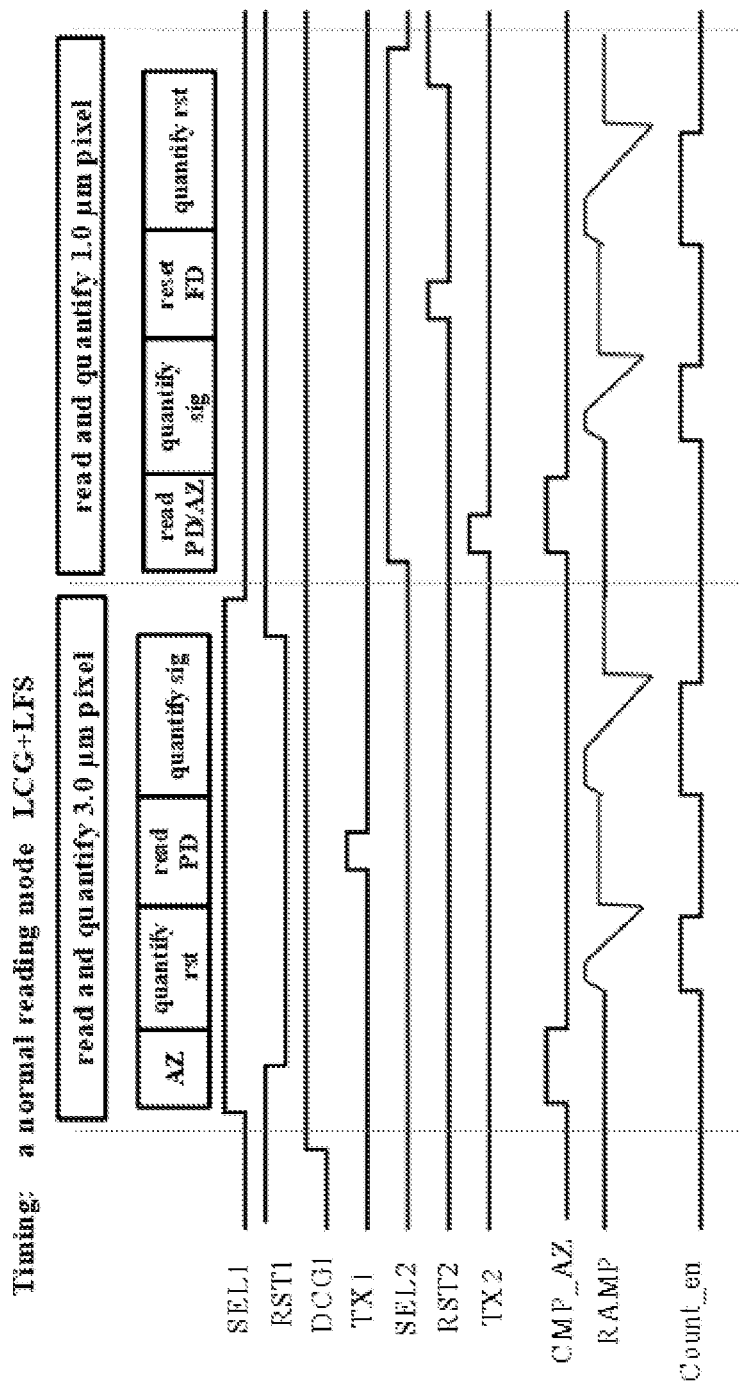
FIG. 4 is a timing diagram of reading a second pixel and reading a first pixel in a low conversion gain mode according to Embodiment 1 of the present disclosure.
Figure 5:
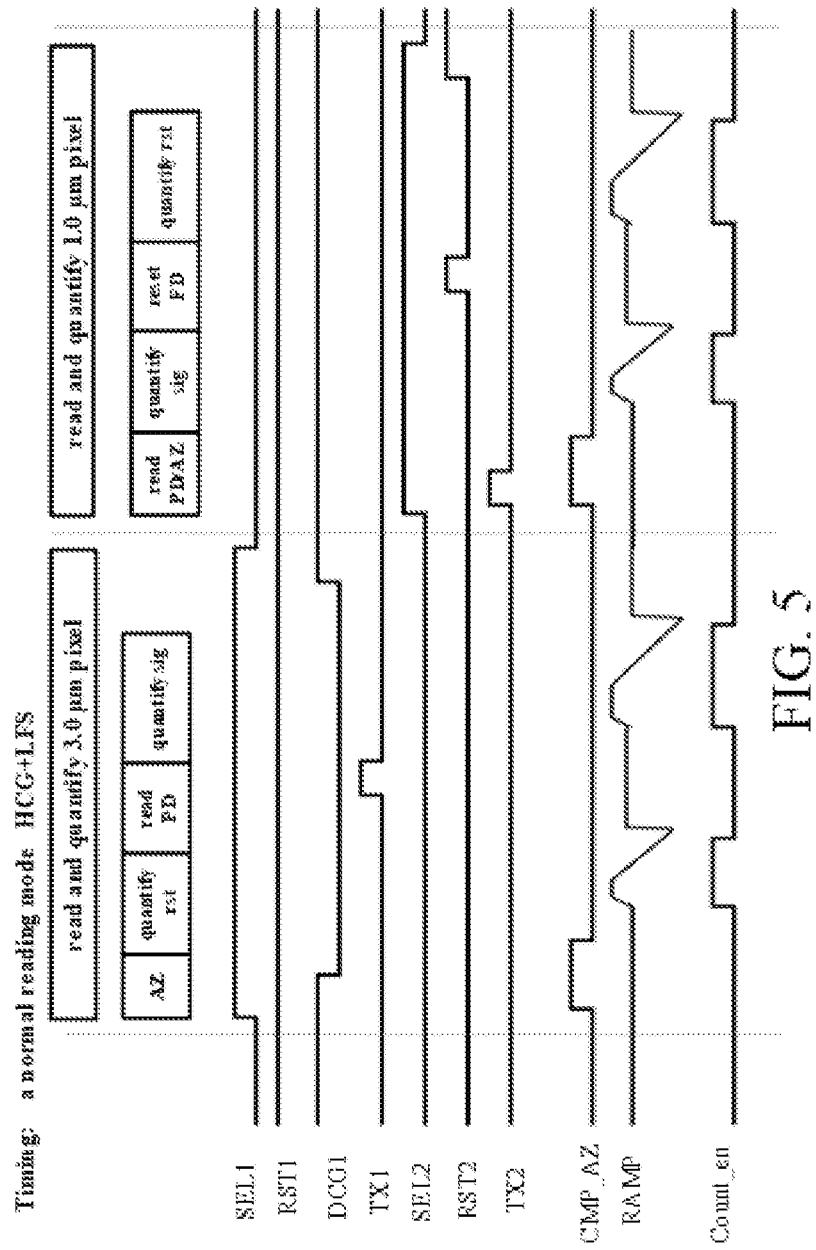
FIG. 5 is a timing diagram of reading a second pixel and reading a first pixel in a high conversion gain mode according to Embodiment 1 of the present disclosure.
Figure 6:
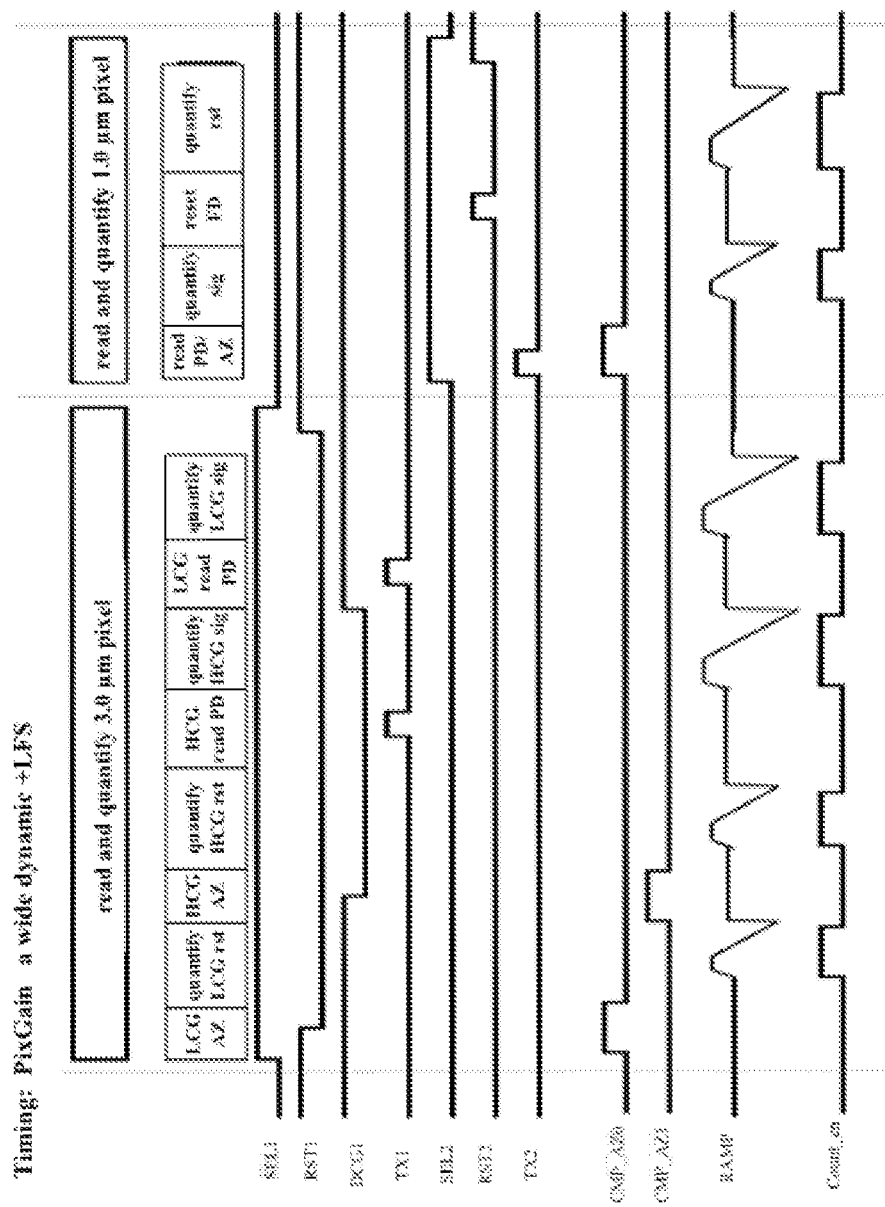
FIG. 6 is a timing diagram of reading a first pixel and a second pixel in a low and high conversion gain mode according to Embodiment 1 of the present disclosure.
Figure 7:
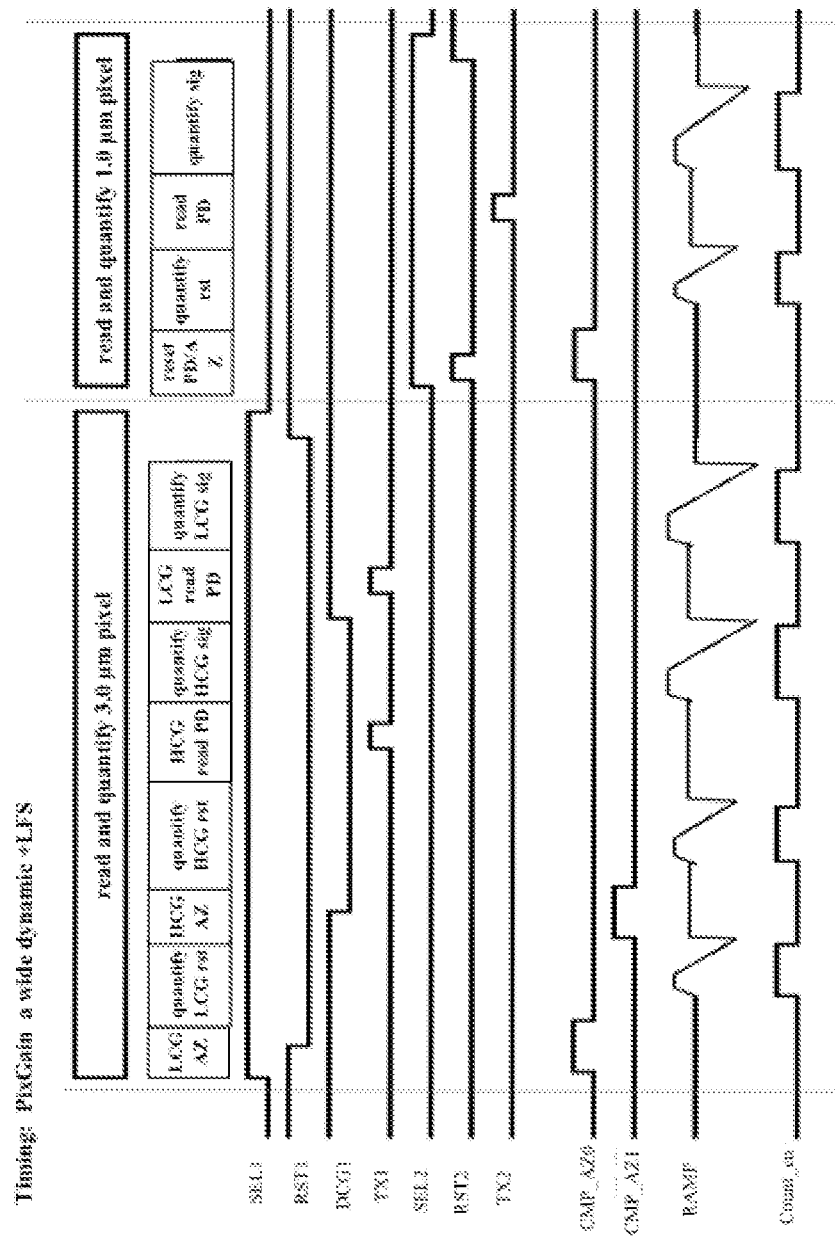
FIG. 7 is a timing diagram of reading a first pixel and a second pixel in a low and high conversion gain mode according to Embodiment 1 of the present disclosure.

In an embodiment, as shown in FIGS. 4-6, the step of quantifying the reset signal may be performed after step 121 is performed. In another embodiment, as shown in FIG. 7, the step of quantifying the reset signal may be performed after step 112 and before step 121. In FIGS. 4-7, 3 μm pixel is an example of the first pixel 100, 1.0 μm pixel is an example of the second pixel 200.

In an embodiment, the reading mode of the first pixel 100 includes at least one of a low conversion gain mode and a high conversion gain mode. The first pixel is read in the low conversion gain mode (as shown in FIG. 4), or is read in the high conversion gain mode (as shown in FIG. 5), or is read in both the low conversion gain mode and the high conversion gain mode (as shown in FIG. 6 and FIG. 7). The high dynamic range is achieved in the above reading modes. In an embodiment, the high conversion gain mode and the low conversion gain mode may be realized by preparing the dual conversion gain transistor DCG1 between the first reset transistor RST1 and the first floating diffusion region of the first pixel. In a further embodiment, the high conversion gain mode and the low conversion gain mode may be realized by preparing a capacitor between the first reset transistor RST1 and the dual conversion gain transistor DCG1, switching between the high conversion gain mode and the low conversion gain mode may be realized by turning on or turning off the dual conversion gain transistor DCG1. In other embodiments, other methods may be adopted to switch between the high conversion gain mode and the low conversion gain mode.

As shown in FIG. 6 and FIG. 7, when the first pixel 100 is read in the high conversion gain mode and the low conversion gain mode, the method of reading the first pixel 100 includes following steps:

Step 113, resetting the storage area of the first pixel in the low conversion gain mode LCG, and quantizing it to obtain the first reset signal lcgrst1 in the low conversion gain mode LCG.

Step 114, resetting the storage area of the first pixel in the high conversion gain mode HCG, and quantizing it to obtain the first reset signal hcgrst1 in the high conversion gain mode HCG.

Step 115, transferring image information of the first photoelectric conversion element in the high conversion gain mode HCG, and quantizing it to obtain the first image sampling signal hcgsig1 in the high conversion gain mode HCG.

Step 116, redistributing image information of the first photoelectric conversion element in the low conversion gain mode LCG, and quantizing it to obtain the first image sampling signal lcgsig1 in the low conversion gain mode LCG.

The first actual image signal of the first pixel is obtained based on the first reset signal lcgrst1 and the first image sampling signal lcgsig1 in the low conversion gain mode, and the first reset signal hcgrst1 and the first image sampling signal hcgsig1 in the high conversion gain mode.

As shown in FIG. 6, one method of reading the second pixel 200 includes following steps: image information of the second photoelectric conversion element is transferred and the second image sampling signal Vsig2 is obtained by quantifying, and then the storage area of the second pixel is reset and the second reset signal Vrst2 is obtained by quantifying. As shown in FIG. 7, another method of reading the second pixel 200 includes following steps: the storage area of the second pixel is reset, the second reset signal Vrst2 is obtained by quantifying, and then the image information of the second photoelectric conversion element is transferred, and the second image sampling signal Vsig2 is obtained by quantifying; and based on this method of reading the second pixel 200, the CDS may be realized. Other execution sequences of the above steps may also be used to read out the second pixel.

Embodiment 2

Figure 8:
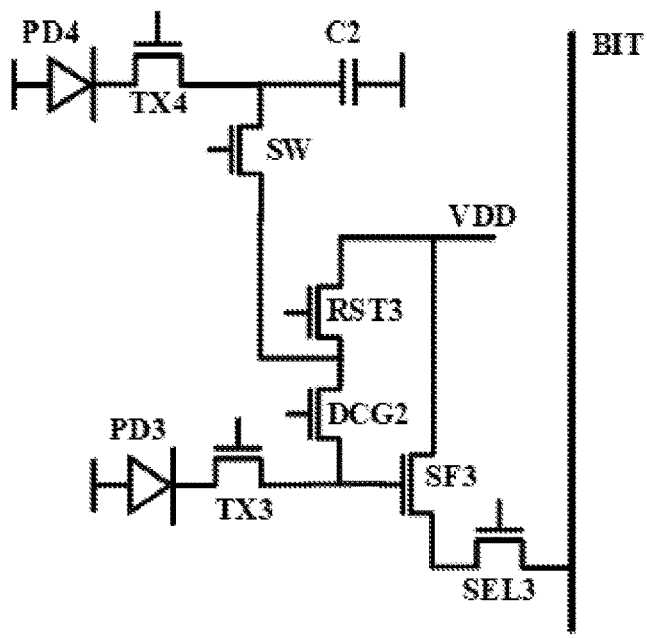
FIG. 8 is a schematic diagram of a circuit principle of a pixel structure according to Embodiment 2 of the present disclosure.
Figure 9:
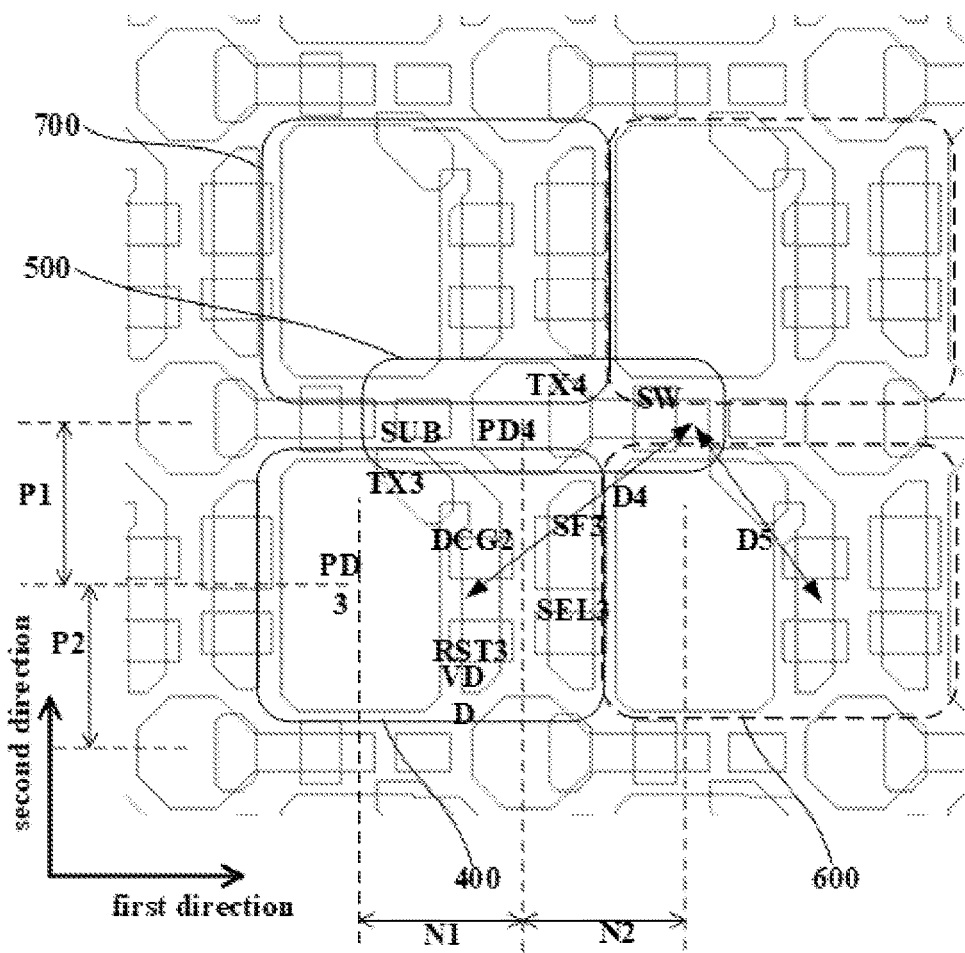
FIG. 9 and FIG. 10 are structural diagrams of the layout of a pixel structure according to Embodiment 2 of the present disclosure.
Figure 10:
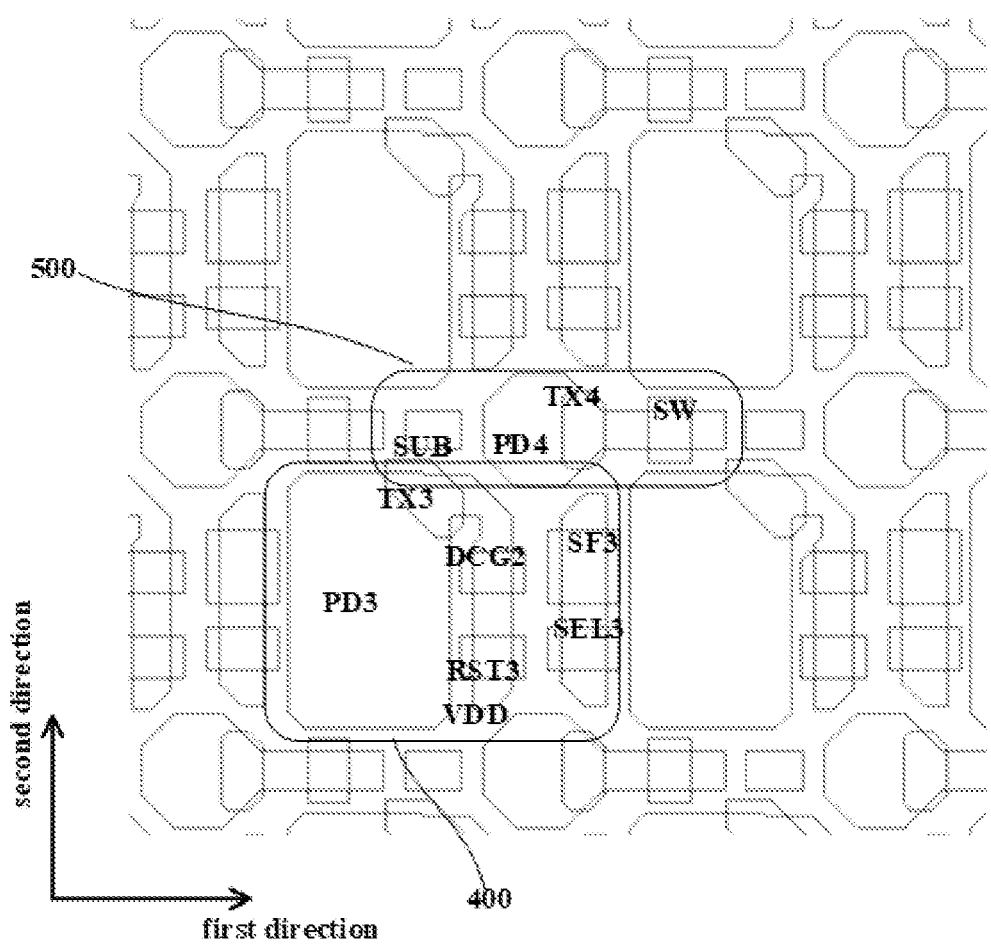

As shown in FIGS. 8-10, the present disclosure provides a pixel structure. The pixel structure includes a plurality of pixel units arranged in an array. Each pixel unit includes a first photoelectric conversion element PD3, a first transfer transistor TX3, a second photoelectric conversion element PD4, a second transfer transistor TX4 and a reading circuit.

The first photoelectric conversion element PD3 is used to capture weak light, and is used to convert light signals (e.g., weak light) into electrical signals. The function of the first photoelectric conversion element PD3 may be set based on an actual situation of a captured scene. The first photoelectric conversion element PD3 includes a photodiode, for example, a PPD type photodiode.

The first transfer transistor TX3 is coupled to a first floating diffusion region, and is for transferring charges in the first photoelectric conversion element PD3 to the first floating diffusion region. In an embodiment, the first floating diffusion region is a shared charge collection region; in other embodiments, the first floating diffusion region includes several floating diffusion points, and the sum of charges collected by all floating diffusion points are charges collected by the first floating diffusion region. The first photoelectric conversion element PD3, the first transfer transistor TX3 and the first floating diffusion region may adopt existing structures in prior art.

The sensitivity of the second photoelectric conversion element PD4 is lower than that of the first photoelectric conversion element PD3. The second photoelectric conversion element PD4 is used to capture strong light, and is used to convert light signals (e.g., strong light) into electrical signals. The second photoelectric conversion element PD4 includes a photodiode, for example, a PPD type photodiode.

The second transfer transistor TX4 is coupled to a second floating diffusion region, and is for transferring charges in the second photoelectric conversion element PD4 to the second floating diffusion region. In some embodiments, the second floating diffusion region is a shared charge collection region; in other embodiments, the second floating diffusion region includes several floating diffusion points, and the sum of charges collected by all floating diffusion points are charges collected by the second floating diffusion region. The second photoelectric conversion element PD4, the second transfer transistor TX4 and the second floating diffusion region may adopt existing structures in prior art.

As shown in FIG. 4, the reading circuit includes a reset transistor RST3 and a source follower transistor SF3. The reset transistor RST3 and the source follower transistor SF3 may adopt an NMOS transistor. A source of the reset transistor RST3 is coupled to the first floating diffusion region and the second floating diffusion region respectively, and a drain of the reset transistor RST3 is coupled to a first common terminal, so as to reset the first floating diffusion region and the second floating diffusion region. A gate of the source follower transistor SF3 is coupled to the first floating diffusion region and the second floating diffusion region respectively, a drain of the source follower transistor SF3 is coupled to a second common terminal, a source of the source follower transistor SF3 is coupled to an output line. The above transistors are N type Metal-Oxide-Semiconductor (NMOS) transistors.

In an embodiment, the reading circuit includes a row select transistor SEL3. A drain of the row select transistor SEL3 is coupled to the source of the source follower transistor SF3, and a source of the row select transistor SEL3 is coupled to the output line. The row select transistor SEL3 may adopts an NMOS transistor.

In an embodiment, the reading circuit further includes a switching transistor SW. The source of the reset transistor RST3 is coupled to the second floating diffusion region through the switching transistor SW, and the gate of the source follower transistor SF3 is coupled to the second floating diffusion region through the switching transistor SW. The output of the second floating diffusion region may be realized by turning off and turning on the switching transistor SW, thereby reading the first floating diffusion region and the second floating diffusion region independently. This embodiment may effectively save the number of transistors in the reading circuit. That is, the first pixel and the second pixel may share one reset transistor (e.g., RST3), one source follower transistor (e.g., SF3) and one row select transistor (e.g., SEL3) after only one switching transistor is added in the reading circuit, which effectively save an area of the pixel structure and reduce manufacturing costs of an image sensor.

In an embodiment, the reading circuit further includes a double conversion gain control transistor DCG2. The double conversion gain control transistor DCG2 is coupled between the first floating diffusion region and the reset transistor RST3 to improve a dynamic range of the pixel structure. The double conversion gain control transistor DCG2 may be an NMOS transistor. In addition, a capacitor may also be set between the reset transistor RST3 and the double conversion gain control transistor DCG2, and the capacitor may be a parasitic capacitor or a device capacitor. A low conversion gain mode and a high conversion gain mode may be switched to each other by turning on and turning off the double conversion gain control transistor DCG2.

It should be noted that the ratio of the number of the first pixel to the number of the second pixel may be the ratio of the number of the first photoelectric conversion element PD3 and the number of the second photoelectric conversion element PD4. The ratio of the number of the first photoelectric conversion element PD3 and the number of the second photoelectric conversion element PD4 may be set according to actual needs. For example, the ratio is 1:1, 2:1, 4:1, and the like. In the embodiment, as shown in FIG. 9 and FIG. 10, the ratio is 1:1.

In an embodiment, as shown in FIG. 9 and FIG. 10, the first pixel 400 includes the first photoelectric conversion element PD3, the first transfer transistor TX3, and the first floating diffusion region. Among them, projections of the first photoelectric conversion element PD3, the first transfer transistor TX3, and the first floating diffusion region in a first direction are arranged in the order of the first photoelectric conversion element PD3, the first transfer transistor TX3, and the first floating diffusion region. And multiple first pixels arranged in a first direction. The second pixel 500 includes the second photoelectric conversion element PD4, the second transfer transistor TX4, and the second floating diffusion region. Among them, projections of the second photoelectric conversion element PD4, the second transfer transistor TX4, and the second floating diffusion region in the first direction are arranged in the order of the second photoelectric conversion element PD4, the second transfer transistor TX4, and the second floating diffusion region. And multiple second pixels arranged in a first direction. A plurality of first pixels 400 are arranged in an array, and a plurality of second pixels 500 are arranged in an array.

In an embodiment, multiple first pixels are arranged in rows along the first direction, and are arranged in columns along a second direction. Optionally, the first direction is perpendicular to the second direction Meanwhile, multiple second pixels are arranged in rows along the first direction, and are arranged in columns along the second direction. In addition, projections of each first photoelectric conversion element of first pixels in the first direction and projections of each second photoelectric conversion element of second pixels in the first direction are alternately arranged, and projections of each first photoelectric conversion element in first pixels in the second direction and projections of each second photoelectric conversion element in second pixels in the second direction are alternately arranged.

In an embodiment, the first pixel and the second pixel adjacent to the first pixel form a pixel unit, among them, a line connecting a projection of the first floating diffusion region of the first pixel 400 in the first direction to a projection of the second floating diffusion region of the second pixel 500 in the first direction avoids a projection of the first transfer transistor TX3 in the first direction. As shown in FIG. 9, any one of the two pixels (e.g. including the first pixel 400 and a fourth pixel 700; for ease of description, another first pixel adjacent to the second pixel 500 in FIGS. 9-10 is referred to as the fourth pixel 700) adjacent to the second pixel 500 and the second pixel 500 may form the pixel unit. That is, the second pixel 500 forms the pixel unit with the first pixel in the solid-line boxes (e.g., the first pixel 400, the fourth pixel 700), and does not form the pixel unit with the first pixel in the dotted-line boxes. This alleviates the effect of the wiring on signal transmission.

As shown in FIG. 9, when the reading circuit includes the switching transistor SW, the switching transistor SW is disposed on a side of the first transfer transistor TX3 along the first direction. The side of the first transfer transistor TX3 is facing away from the photoelectric conversion element PD3. In an embodiment, the second pixel 500 is first determined. Then the first pixel 400 is selected from multiple pixels adjacent to the second pixel 500, and a distance between a projection of the first floating diffusion region of the first pixel 400 in the first direction and a projection of the switching transistor SW of the second pixel 500 in the first direction is further than distances between projections of the floating diffusion regions of other pixels adjacent to the second pixel 500 in the first direction and the projection of the switching transistor SW of the second pixel 500 in the first direction. Therefore, the first pixel 400 and the second pixel 500 are selected to form the pixel unit. Because the distance between the projection of the first floating diffusion region of the first pixel 400 in the first direction and the projection of the switching transistor SW of the second pixel 500 in the first direction is relatively large, the wiring avoids the first transfer transistor TX3 and the second pixel 500 is connected to the first pixel 400 to share one reading circuit.

As shown in FIG. 9, in the two pixels (including the first pixel 400 and a third pixel 600, wherein for ease of description, another first pixel adjacent to the second pixel 500 in FIG. 9 is referred to as the third pixel 600) adjacent to the second pixel 500, a distance D5 between the switching transistor SW and the first floating diffusion region of the third pixel 600 is considered as a distance between the switching transistor SW and the third pixel 600, a distance D4 between the switching transistor SW and the first floating diffusion region of the first pixel 400 is considered as a distance between the switching transistor SW and the first pixel 400. Because a projection of the distance D5 in the first direction is shorter than a projection of the distance D4 in the first direction, the first floating diffusion region of the third pixel 600 will be greatly affected when the switching transistor SW is turned on and turned off. Therefore, the second pixel 500 and the first pixel 400 (instead of the third pixel 600) in this embodiment are selected to form the pixel unit. Because the projection of the distance D4 in the first direction is greater than the projection of the distance D5 in the first direction, the impact on the first floating diffusion region of the first pixel 400 is minor when the switching transistor SW is turned on and turned off. In addition, when the switching transistor SW is connected to the reset transistor RST3 through the wiring, the wiring does not pass through the first transfer transistor of the first pixel, thereby reducing the influence on signals.

In an embodiment, in one pixel unit, a distance between the first source follower transistor SF3 of the first pixel 400 and the second pixel 500 is set to be less than a distance between the first row select transistor SEL3 of the first pixel 400 and the second pixel 500. As showing FIG. 10, the first pixel 400 and the second pixel 500 are selected to form the pixel unit, to obtain a better layout and improve the performance of the image sensor.

In an embodiment, as shown in FIG. 9, each second photoelectric conversion element PD4 is disposed at a center of a pattern formed by four first photoelectric conversion elements PD3 arranged in an array, and the second transfer transistor TX4 and the switching transistor SW are sequentially arranged between two adjacent second photoelectric conversion elements PD4 along the first direction. The first reset transistor RST3, the first source follower transistor SF3, the first row select transistor SEL3 are arranged between two adjacent second photoelectric conversion elements PD4 along the second direction perpendicular to the first direction. Further, each of four corner regions of each first photoelectric conversion element PD3 (in this embodiment, PD3 has four corners) is also correspondingly provided with a second photoelectric conversion element PD4, and each of four corner regions of each second photoelectric conversion element PD4 (in this embodiment, PD4 has four corners) is also correspondingly provided with a first photoelectric conversion element PD3.

In an embodiment, when the pixel unit further includes a dual conversion gain control transistor DCG2. The dual conversion gain control transistor DCG2 and the first reset transistor RST3 are arranged in a column along the second direction, the first source follower transistor SF3 and the first row select transistor SEL3 are arranged in a column along the second direction, and the dual conversion gain control transistor DCG2 and the first reset transistor RST3 are arranged close to the first photoelectric conversion element PD3 in a same pixel unit. Among them, the gain control transistor DCG2, the first reset transistor RST3 and the first photoelectric conversion element PD3 are arranged in the first pixel 400.

In an embodiment, the pixel unit further includes a substrate contact SUB. The substrate contact SUB is disposed on a side of the second photoelectric conversion element PD4 along the second direction, the side of the second photoelectric conversion element PD4 is facing away from the second transfer transistor TX4. That is, the substrate contact SUB is disposed in a region between the first photoelectric conversion element PD3 and second photoelectric conversion element PD4, and the first photoelectric conversion element PD3 and second photoelectric conversion element PD4 are in one pixel unit. Under a certain potential, a potential barrier for the low of electrons is formed on the substrate contact SUB, and the potential barrier may effectively block the leakage of electrons in the first pixel 400 to the surrounding second pixels 500, thereby isolating the first pixel 400 from the second pixel 500.

In an embodiment, in one pixel unit, a distance between a projection of a center of the first photoelectric conversion element PD3 in the second direction and a projection of a center of the second photoelectric conversion element PD4 in the second direction is a first distance P1. In two adjacent pixel units, a distance between a projection of a center of the first photoelectric conversion element PD3 of one pixel unit in the second direction and a projection of a center of the second photoelectric conversion element PD4 of the other pixel unit in the second direction is a second distance P2. The first distance P1 is larger than the second distance P2.

In the embodiment, in one pixel unit, the first photoelectric conversion element PD3 is relatively far away from the second photoelectric conversion element PD4, so that when electrons are being leaked, paths for electrons to leak from the first photoelectric conversion element PD3 to the second photoelectric conversion element PD4 are also longer, so that leaked electrons are more easily absorbed by the voltage terminal VDD of the same first pixel. That is, because the voltage terminal VDD is closer to the first photoelectric conversion element PD1, part of electrons leaked from the first photoelectric conversion element PD3 flows to the voltage terminal VDD. Therefore, the number of electrons leaked from the first photoelectric conversion element PD3 to the second photoelectric conversion element PD4 is reduced, which improve the image accuracy.

In an embodiment, in one pixel unit, a distance between the projection of the center of the first photoelectric conversion element PD3 in the first direction and the projection of the center of the second photoelectric conversion element PD4 in the first direction is a third distance N1. In two adjacent pixel units, a distance between the projection of the center of the first photoelectric conversion element PD3 of one pixel unit in the first direction and the projection of the center of the second photoelectric conversion element PD4 of the other pixel unit in the first direction is a fourth distance N2. The third distance N1 is equal to the fourth distance N2.

In an embodiment, an area of the first photoelectric conversion element PD3 is larger than that of the second photoelectric conversion element PD4, so that the sensitivity of the second photoelectric conversion element PD4 is lower than that of the first photoelectric conversion element PD3.

In an embodiment, the pixel structure also includes one or more an attenuation layers, and there is at least one anti-reflection layer disposed between the second photoelectric conversion element PD4 and an incident light, so that the sensitivity of the second photoelectric conversion element PD4 is lower than that of the first photoelectric conversion element PD3. The attenuation layer may adopt existing attenuation structures. For example, an material layer, or a metal grid are arranged between the photoelectric conversion element and the incident light. The attenuation layer is facing a light-receiving surface of the second photoelectric conversion element PD4. In another embodiment, the attenuation layer may be further extended to the first photoelectric conversion element PD3.

In an embodiment, in one pixel unit, the first pixel 400 and the second pixel 500 are respectively provided with a color filter of the same color. For example, multiple first pixels 400 may form a Bayer array arrangement, and multiple second pixels 500 may form a Bayer array arrangement. The other color filters may be configured according to actual needs. In the embodiment, the first pixel 400 and the second pixel 500 of one pixel unit are respectively provided with a color filter of the same color. That is, color filters of the same color are configured on the first photoelectric conversion element PD3 and the second photoelectric conversion element PD4 in one pixel unit.

In an embodiment, in one pixel unit, the first pixel 400 corresponds to a first lens, and the second pixel 500 corresponds to a second lens. In the embodiment, each of the first pixels 400 corresponds to a corresponding one of the first lenses, and each of the second pixels 500 corresponds to a corresponding one of the second lenses. The first lens and the second lens may be different, for example, the height of the first lens is different from that of the second lens.

In an embodiment, as shown in FIG. 8, the pixel unit includes a charge storage device. A terminal of the charge storage device is coupled to the second floating diffusion region, the other terminal of the charge storage device is connected to ground or a variable voltage.

In an embodiment, the charge storage device is a capacitor C2. The charge storage device is used to storage charges generated by the second photoelectric conversion element PD2, to increase a full well capacity of the second pixel 500 and to reduce the sensitivity of the photoelectric conversion element. Optionally, the capacitor C2 is a device capacitance or a parasitic capacitance.

The present disclosure provides an image sensor. The image sensor includes the pixel structure described in the above embodiments. The image sensor may be a complementary metal oxide semiconductor (CMOS) image sensor, or may be other image sensors that may use pixel structures described in the above embodiments.

The present disclosure also provides an electronic device. The electronic device includes the image sensor described in the above embodiments. The electronic device may be a mobile device, a digital camera, a medical device, or a computer. The electronic device includes the image sensor. The specific structure of the image sensor refers to the above embodiments. Since the electronic device adopts all the technical solutions of all the above embodiments, it has at least all the beneficial effects brought by the technical solutions of the above embodiments. In addition, the electronic equipment may also be monitoring equipment, machine vision related device, UAV, mobile phones, cameras, and the like.

Figure 11:
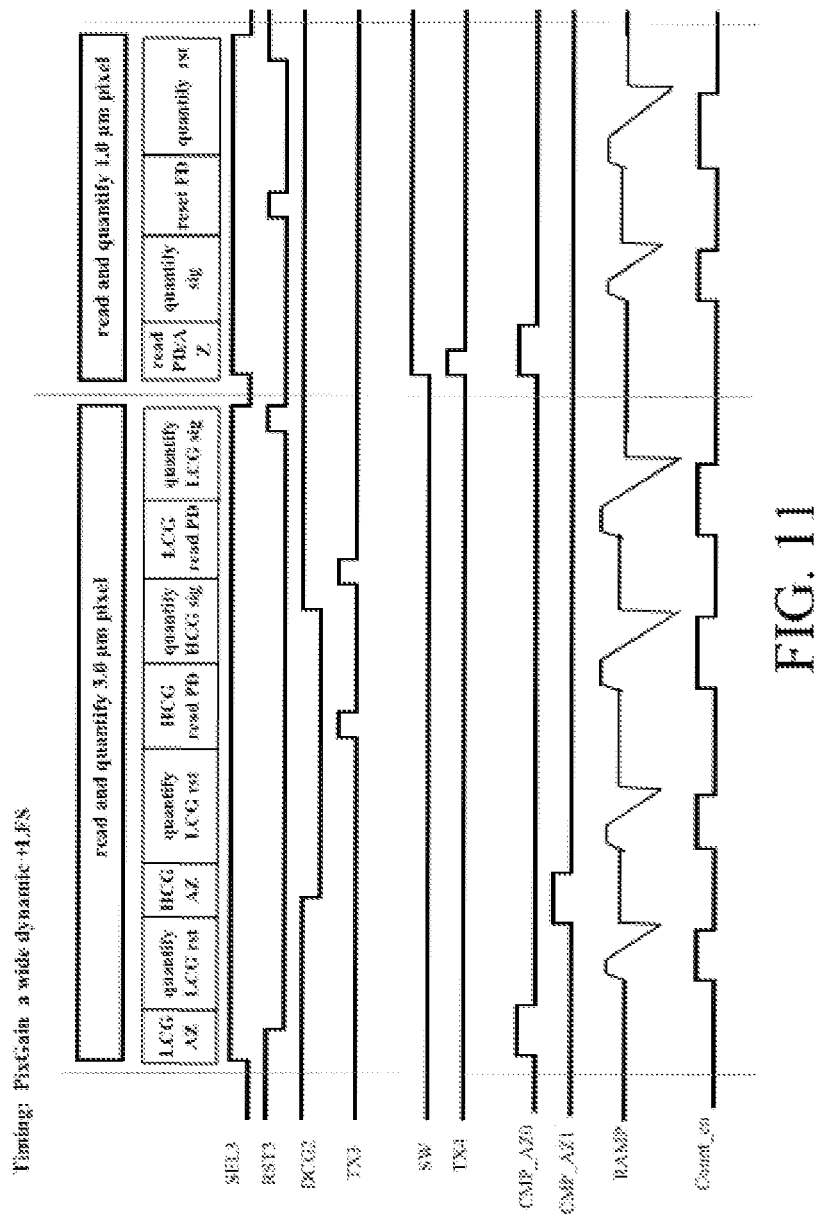
FIG. 11 is a timing diagram of reading a first pixel and a second pixel in a low and high conversion gain mode according to Embodiment 2 of the present disclosure.
Figure 12:
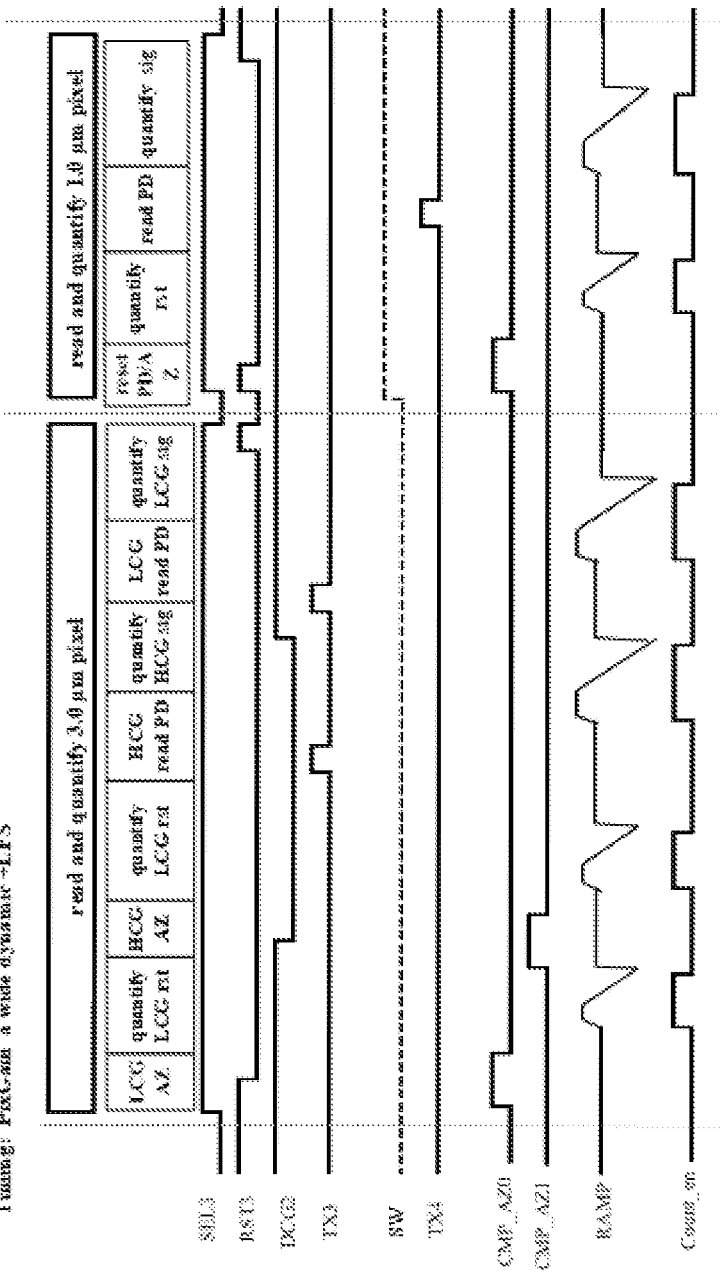
FIG. 12 is a timing diagram of reading a first pixel and a second pixel in a low and high conversion gain mode according to Embodiment 2 of the present disclosure.

As shown in FIGS. 11-12, the present disclosure also provides a method for controlling an image sensor, which is applicable to the image sensor described in the above embodiments. The method includes step 210 and step 220:

Step 210, reading information of the first pixel 400, where the first pixel 400 includes the first photoelectric conversion element PD3 and the first transfer transistor TX3. The step 210 of reading information of the first pixel 400 includes step 211 and step 212.

Step 211, resetting a storage region of the first pixel 400, and quantizing it to obtain a first reset signal Vrst1.

Step 212, transferring image information of the first photoelectric conversion element PD3, and quantizing it to obtain a first image sampling signal Vsig1.

Step 220, reading information of the second pixel 500, where the second pixel 500 includes the second photoelectric conversion element PD4 and the second transfer transistor TX4. The step 220 of reading information of the second pixel 500 includes step 221.

Step 221, transferring image information of the first photoelectric conversion element PD4, and quantizing it to obtain a second image sampling signal Vsig2.

a first actual image signal of the first pixel 400 is obtained based on the first reset signal Vrst1 and the first image sampling signal Vsig1, and a second actual image signal of the second pixel 500 is obtained based on the second image sampling signal Vsig2. It should be noted that the execution sequence of steps 111, 112, and 121 does not strictly represent the execution sequence of each step of the method in the present disclosure, and those skilled in the art may change the execution sequence of the above steps according to actual needs. Based on a reading mode of the first pixel, the CDS may be realized.

In an embodiment, step 120 of reading information of the second pixel 500 also includes:

Step 122, resetting a storage region of the second pixel 500, and quantizing it to obtain a second reset signal Vrst2;

and obtaining a second actual image signal based on the second reset signal Vrst2 and the second image sampling signal Vsig2.

In an embodiment, as shown in FIGS. 11, the step of quantifying the reset signal may be performed after step 121. In another embodiment, as shown in FIG. 12, the step of quantifying the reset signal may be performed alter step 112 and before step 121. In FIGS. 11-12, 3 μm pixel is an example of the first pixel 400, 1.0 μm pixel is an example of the second pixel 500.

In an embodiment, the reading mode of the first pixel 400 includes at least one of a low conversion gain mode and a high conversion gain mode. The first pixel is read in the low conversion gain mode (as shown in FIG. 4), or is read in the high conversion gain mode (as shown in FIG. 5), or is read in both the low conversion gain mode and the high conversion gain mode (as shown in FIG. 11 and FIG. 12). The high dynamic range is achieved in the above reading modes. In an embodiment, the high conversion gain mode and the low conversion gain mode may be realized by preparing the conversion gain transistor DCG2 between the reset transistor RST3 and the first floating diffusion region. In a further embodiment, the high conversion gain mode and the low conversion gain mode may be realized by preparing a capacitor between the reset transistor RST3 and the dual conversion gain transistor DCG2, switching between the high conversion gain mode and the low conversion gain mode may be realized by turning on or turning off the dual conversion gain transistor DCG2. In other embodiments, other methods may be adopted to switch between the high conversion gain mode and the low conversion gain mode.

As shown in FIG. 11 and FIG. 12, when the first pixel 400 is read in the high conversion gain mode and the low conversion gain mode, the method of reading the first pixel 400 includes following steps:

Step 213, resetting the storage area of the first pixel in the low conversion gain mode LCG, and quantizing it to obtain the first reset signal lcgrst1 in the low conversion gain mode LCG.

Step 214, resetting the storage area of the first pixel in the high conversion gain mode HCG, and quantizing it to obtain the first reset signal hcgrst1 in the high conversion gain mode HCG.

Step 215, transferring image information of the first photoelectric conversion element in the high conversion gain mode HCG, and quantizing it to obtain the first image sampling signal hcgsig1 in the high conversion gain mode HCG.

Step 216, redistributing image information of the first photoelectric conversion element in the low conversion gain mode LCG, and quantizing it to obtain the first image sampling signal lcgsig1 in the low conversion gain mode LCG.

The first actual image signal of the first pixel is obtained based on the first reset signal lcgrst1 and the first image sampling signal lcgsig1 in the low conversion gain mode, and the first reset signal hcgrst1 and the first image sampling signal hcgsig1 in the high conversion gain mode. It should be noted that the method of reading the first pixel in the low conversion gain mode or the high conversion gain mode refers to FIG. 4 and FIG. 5 in the embodiment 1.

As shown in FIG. 11, one method of reading the second pixel 500 includes following steps: image information of the second photoelectric conversion element is transferred, the second image sampling signal Vsig2 is obtained by quantizing, and then the storage area of the second pixel is reset, and the second reset signal Vrst2 is obtained by quantizing.

FIG. 11 shows a signal transmission timing with the switching transistor SW. As shown in FIG. 12, another method of reading the second pixel 500 includes following steps: the storage area of the second pixel is reset, the second reset signal Vrst2 is obtained by quantizing, and then the image information of the second photoelectric conversion element is transferred, and the second image sampling signal Vsig2 is obtained by quantizing; based on this above method of reading the second pixel 500, the CDS may be realized.

FIG. 12 shows a signal transmission timing without the switching transistor SW and a signal transmission timing with the switching transistor SW (the timing of the switching transistor SW in FIG. 12 is shown by a dotted line). Other execution sequences of the above steps may also be used to read out the second pixel.

As described above, the pixel structure, the image sensor, the electronic device and the method for controlling an image sensor in the present disclosure have the following beneficial effects:

The present disclosure adopts the first photoelectric conversion element and the second photoelectric conversion element which have different sensitivities. The first photoelectric conversion element has high sensitivity (due to, e.g., a large area), which is mainly used to obtain weak light information, and the second photoelectric conversion element has low sensitivity (due to, e.g., a small area), which is mainly used to obtain strong light information. Therefore, the image sensor of the present disclosure is able to recognize strong light information and low light information, which improves its dynamic range.

The present disclosure designs the layout of the pixel structure, which may effectively reduce a signal noise, improve a reading accuracy, and reduce the amount of electrons flowing from the large-area first photoelectric conversion element to the small-area second photoelectric conversion element, thereby improving the performance of the image sensor.

In summary, the present disclosure effectively overcomes various defects in the prior art and has a high industrial value.

The above-mentioned embodiments are merely illustrative of the principle and effects of the present disclosure instead of limiting the present disclosure. Modifications or variations of the above-described embodiments may be made by those skilled in the art without departing from the spirit and scope of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A pixel structure, wherein the pixel structure comprises a plurality of pixel units arranged in an array, and each pixel unit comprises:
   a first photoelectric conversion element;
   a first transfer transistor, coupled to a first floating diffusion region, for transferring charges in the first photoelectric conversion element to the first floating diffusion region;
   a second photoelectric conversion element, wherein the sensitivity of the second photoelectric conversion element is lower than that of the first photoelectric conversion element;

a second transfer transistor, coupled to a second floating diffusion region, for transferring charges in the second photoelectric conversion element to the second floating diffusion region; and a reading circuit, coupled to the first floating diffusion region and the second floating diffusion region, for reading voltage signals of the first floating diffusion region and the second floating diffusion region;

wherein the reading circuit comprises a first reset transistor, and a first source follower transistor, wherein the first reset transistor and the first source follower transistor are arranged between two adjacent second photoelectric conversion elements.

2. The pixel structure according to claim 1, wherein the reading circuit comprises:

the first reset transistor, wherein a source of the first reset transistor is coupled to the first floating diffusion region, a drain of the first reset transistor is coupled to a first voltage terminal, and the first reset transistor is for resetting the first floating diffusion region;

the first source follower transistor, wherein a gate of the first source follower transistor is coupled to the first floating diffusion region, a drain of the first source follower transistor is coupled to a second voltage terminal, and a source of the first source follower transistor is coupled to a first output line;

a second reset transistor, wherein a source of the second reset transistor is coupled to the second floating diffusion region, a drain of the second reset transistor is coupled to a third voltage terminal, and the second reset transistor is for resetting the second floating diffusion region; and a second source follower transistor, wherein a gate of the second source follower transistor is coupled to the second floating diffusion region, a drain of the second source follower transistor is coupled to a fourth voltage terminal, a source of the second source follower transistor is coupled to a second output line.

3. The pixel structure according to claim 2, wherein the first voltage terminal, the second voltage terminal, the third voltage terminal and the fourth voltage terminal are the same voltage terminal; and/or, the first output line and the second output line is the same output line.

4. The pixel structure according to claim 2, wherein the reading circuit comprises:

a first row select transistor, wherein a drain of the first row select transistor is coupled to the source of the first source follower transistor, and a source of the first row select transistor is coupled to the first output line, and a second row select transistor, wherein a drain of the second row select transistor is coupled to the source of the second source follower transistor, and a source of the second row select transistor is coupled to the second output line, and/or a double conversion gain control transistor, coupled between the first floating diffusion region and the first reset transistor.

5. The pixel structure according to claim 4, wherein a first pixel comprises the first photoelectric conversion element, the first transfer transistor, the first floating diffusion region, the first reset transistor, the first source follower transistor, and the first row select transistor, multiple first pixels arranged in a first direction; a second pixel comprises the second photoelectric conversion element, the second transfer transistor, the second floating diffusion, the second reset transistor, the second source follower transistor, and the second row select transistor, multiple second pixels arranged in a first direction; a plurality of first pixels are arranged in an array, and a plurality of second pixels are arranged in an array, wherein the first pixel and the second pixel adjacent to the first pixel form a pixel unit, wherein a distance between a projection of the first row select transistor of the first pixel in a first direction and a projection of the second row select transistor of the second pixel in the first direction is shorter than those between the projection of the first row select transistor of the first pixel in the first direction and projections of second row select transistors of other pixels in the first direction.

6. The pixel structure according to claim 5, wherein in one pixel unit, a distance between the first source follower transistor of the first pixel and the second pixel is set to be less than a distance between the first row select transistor of the first pixel and the second pixel.

7. The pixel structure according to claim 5, wherein each second photoelectric conversion element is disposed at a center of a pattern formed by four first photoelectric conversion elements arranged in an array, the second transfer transistor, the second reset transistor, the second source follower transistor and the second row select transistors are sequentially arranged between two adjacent second photoelectric conversion elements along the first direction; the first reset transistor, the first source follower transistor, the first row select transistors are arranged between two adjacent second photoelectric conversion elements along a second direction perpendicular to the first direction.

8. The pixel structure according to claim 7, wherein when the pixel unit further comprises a dual conversion gain control transistor, the dual conversion gain control transistor and the first reset transistor are arranged in a column along the second direction, the first source follower transistor and the first row select transistor are arranged in a column along the second direction, and the gain control transistor and the first reset transistor are arranged close to the first photoelectric conversion element in a same pixel unit, wherein the dual conversion gain control transistor, the first reset transistor and the first photoelectric conversion element are arranged in one first pixel.

9. The pixel structure according to claim 8, wherein the pixel unit further comprises:

a substrate contact, wherein the substrate contact is disposed on a side of the first row select transistor along the second direction, the side of the first row select transistor is facing away from the first source follower transistor.

10. The pixel structure according to claim 5, wherein in one pixel unit, a distance between a projection of a center of the first photoelectric conversion element in the second direction and a projection of a center of the second photoelectric conversion element in the second direction is a first distance; in two adjacent pixel units, a distance between a projection of a center of the first photoelectric conversion element of one pixel unit in the second direction and a projection of a center of the second photoelectric conversion element of the other pixel unit in the second direction is a second distance; the first distance is larger than the second distance; and/or, in one pixel unit, a distance between the projection of the center of the first photoelectric conversion element in the first direction and the projection of the center of the second photoelectric conversion element in the first direction is a third distance; in two adjacent pixel units, a distance between the projection of the center of the first photoelectric conversion element of one pixel unit in the first direction and the projection of the center of the second photoelectric conversion element of the other pixel unit in the first direction is the fourth distance, wherein the third distance is equal to the fourth distance.

11. The pixel structure according to claim 1, wherein the reading circuit comprises:
   a reset transistor, wherein a source of the reset transistor is coupled to the first floating diffusion region and the second floating diffusion region respectively, a drain of the reset transistor is coupled to a first common terminal, the reset transistor is for resetting the first floating diffusion region and the second floating diffusion region; and
   a source follower transistor, a gate of the source follower transistor is coupled to the first floating diffusion region and the second floating diffusion region respectively, a drain of the source follower transistor is coupled to a second common terminal, a source of the source follower transistor is coupled to an output line.

12. The pixel structure according to claim 11, wherein the reading circuit comprises:
   a switching transistor, wherein the source of the reset transistor is coupled to the second floating diffusion region through the switching transistor, and a gate of the source follower transistor is coupled to the second floating diffusion region through the switching transistor, and/or
   a gain control transistor, coupled between the first floating diffusion region and the reset transistor.

13. The pixel structure according to claim 11,
   wherein the reading circuit further comprises a row select transistor, wherein a drain of the row select transistor is coupled to the source of the source follower transistor, and a source of the row select transistor is coupled to the output line;
   wherein a first pixel comprises the first photoelectric conversion element, the first transfer transistor, and the first floating diffusion region, multiple first pixels arranged in a first direction; a second pixel comprises the second photoelectric conversion element, the second transfer transistor, the second floating diffusion region, the second reset transistor, the second source follower transistor and the second row select transistor, multiple first pixels arranged in a first direction; a plurality of the first pixel are arranged in an array, and a plurality of the second pixel are arranged in an array, wherein the first pixel and the second pixel adjacent to the first pixel form a pixel unit, wherein a line connecting a projection of the first floating diffusion region of the first pixel in the first direction to a projection of the second floating diffusion region of the second pixel in the first direction does not intersect a projection of the first transfer transistor in the first direction.

14. The pixel structure according to claim 13, when the reading circuit includes a switching transistor, wherein the switching transistor is disposed on a side of the second transfer transistor along the first direction, the side of the second transfer transistor is facing away from the second photoelectric conversion element, wherein the second pixel and the first pixel adjacent to the second pixel form the pixel unit, wherein a distance between a projection of the first floating diffusion region of the first pixel in the first direction and a projection of the switching transistor of the second pixel in the first direction is further than those between projections of the first floating diffusion regions of a plurality of pixels adjacent to the second pixel in the first direction and the projection of the switching transistor of the second pixel in the first direction.

15. The pixel structure according to claim 13, wherein in one pixel unit, a distance between the first source follower transistor of the first pixel and the second pixel is set to be less than a distance between the first row select transistor of the first pixel and the second pixel.

16. The pixel structure according to claim 13, wherein each second photoelectric conversion element is disposed at a center of a pattern formed by four first photoelectric conversion elements arranged in an array, the second transfer transistor and the switching transistor are sequentially arranged between two adjacent second photoelectric conversion elements along the first direction, the first reset transistor, the first source follower transistor, the first row select transistors are arranged between two adjacent second photoelectric conversion elements along a second direction perpendicular to the first direction.

17. The pixel structure according to claim 16, wherein when the pixel unit further comprises a dual conversion gain control transistor, the dual conversion gain control transistor and the first reset transistor are arranged are arranged in a column along the second direction, the first source follower transistor and the first row select transistor are arranged in a column along the second direction, and the dual conversion gain control transistor and the first reset transistor are arranged close to the first photoelectric conversion element in a same pixel unit, wherein the gain control transistor, the first reset transistor and the first photoelectric conversion element are arranged in one first pixel.

18. The pixel structure according to claim 17, wherein the pixel unit further comprises:
   a substrate contact, wherein the substrate contact is disposed on a side of the second photoelectric conversion element along the second direction, the side of the second photoelectric conversion element is facing away from the second transfer transistor.

19. The pixel structure according to claim 16, wherein in one pixel unit, a distance between a projection of a center of the first photoelectric conversion element in the second direction and a projection of a center of the second photoelectric conversion element in the second direction is a first distance; In two adjacent pixel units, a distance between a projection of a center of the first photoelectric conversion element of one pixel unit in the second direction and a projection of a center of the second photoelectric conversion element of the other pixel unit in the second direction is a second distance; the first distance is larger than the second distance; and/or, in one pixel unit, a distance between the projection of the center of the first photoelectric conversion element in the first direction and the projection of the center of the second photoelectric conversion element in the first direction is a third distance; in two adjacent pixel units, a distance between the projection of the center of the first photoelectric conversion element of one pixel unit in the first direction and the projection of the center of the second photoelectric conversion element of the other pixel unit in the first direction is the fourth distance, wherein the third distance is equal to the fourth distance.

20. The pixel structure according to claim 1, further comprising:
   at least one attenuation layer, wherein there is at least one attenuation layer is disposed between the second photoelectric conversion element and an incident light;
   and/or an area of the first photoelectric conversion element is larger than that of the second photoelectric conversion element.

21. The pixel structure according to claim 13, wherein in one pixel unit, the first pixel and the second pixel are provided with a color filter of the same color respectively; and/or, in one pixel unit, the first pixel corresponds to a first lens, the second pixel corresponds to a second lens.

22. The pixel structure according to claim 1, wherein the pixel unit further comprises a charge storage device, one terminal of the charge storage device is coupled to the second floating diffusion region, and the other terminal of the charge storage device is connected to ground or a variable voltage.

23. An image sensor, comprising: a pixel structure as claimed in claim 1, and a peripheral logic circuit for receiving and processing signals output by a reading circuit of the pixel structure.

24. A method for controlling an image sensor, applicable to the image sensor as claimed in claim 1, comprising:
reading information of a first pixel, wherein the first pixel comprises a first photoelectric conversion element and a first transfer transistor;
wherein the step of reading information of a first pixel comprises:
resetting a storage region of the first pixel, and quantizing it to obtain a first reset signal;
transferring image information of the first photoelectric conversion element, and quantizing it to obtain a first image sampling signal;
reading information of a second pixel, wherein the second pixel comprises a second photoelectric conversion element and a second transfer transistor;
wherein the step of reading information of a second pixel comprises:
transferring image information of the second photoelectric conversion element, and quantizing it to obtain a second image sampling signal;
wherein, a first actual image signal of the first pixel is obtained based on the first reset signal and the first image sampling signal, and a second actual image signal of the second pixel is obtained based on the second image sampling signal.

25. The method for controlling an image sensor according to claim 24, the step of reading information of a second pixel also comprises:
resetting a storage region of the second pixel, and quantizing it to obtain a second reset signal, and quantizing it to obtain a second actual image signal based on the second image reset signal and the second image sampling signal.

26. The method for controlling an image sensor according to claim 24, wherein the reading mode of the first pixel comprises at least one of a low conversion gain mode and a high conversion gain mode, when the first pixel is read in both the low conversion gain mode and the high conversion gain mode, the step of reading information of a first pixel comprise following steps:
resetting the storage area of the first pixel in the low conversion gain mode, and quantizing it to obtain the first reset signal in the low conversion gain mode;
resetting the storage area of the first pixel in the high conversion gain mode, and quantizing it to obtain the first reset signal in the high conversion gain mode;
transferring image information of the first photoelectric conversion element in the high conversion gain mode, and quantizing it to obtain the first image sampling signal in the high conversion gain mode;
redistributing image information of the first photoelectric conversion element in the low conversion gain mode, and quantizing it to obtain the first image sampling signal in the low conversion gain mode;
wherein, the first actual image signal of the first pixel is obtained, based on the first reset signal and the first image sampling signal in the low conversion gain mode, and the first reset signal and the first image sampling signal in the high conversion gain mode.

* * * * *